(12) United States Patent
Ho et al.

(10) Patent No.: US 9,960,671 B2
(45) Date of Patent: May 1, 2018

(54) ISOLATOR WITH REDUCED SUSCEPTIBILITY TO PARASITIC COUPLING

(71) Applicant: Avago Technologies General IP (Singapore) Pte. Ltd., Singapore (SG)

(72) Inventors: Dominique Ho, Singapore (SG); Kwee Chong Chang, Singapore (SG); Kah Weng Lee, Singapore (SG); Brian J. Misek, Singapore (SG)

(73) Assignee: AVAGO TECHNOLOGIES GENERAL IP (SINGAPORE) PTE. LTD., Singapore (SG)

(*) Notice: Subject to any disclaimer, the term of this patent is extended or adjusted under 35 U.S.C. 154(b) by 405 days.

(21) Appl. No.: 14/588,112

(22) Filed: Dec. 31, 2014

(65) Prior Publication Data

US 2016/0190918 A1 Jun. 30, 2016

(51) Int. Cl.
*H02M 3/06* (2006.01)
*H02M 1/32* (2007.01)
(Continued)

(52) U.S. Cl.
CPC .......... *H02M 3/06* (2013.01); *H01L 23/3107* (2013.01); *H01L 23/48* (2013.01); *H01L 23/49537* (2013.01); *H01L 23/49575* (2013.01); *H01L 23/5223* (2013.01); *H01L 23/58* (2013.01); *H01L 23/60* (2013.01); *H01L 24/05* (2013.01); *H01L 24/49* (2013.01);
(Continued)

(58) Field of Classification Search
CPC ............. H01L 24/16; H01L 24/32; H01L 2224/16145; H01L 2224/32145; H01L 25/0657; H01L 25/50; H01L 2924/1711; H01L 2924/172; H01L 2924/3025; H01L 2924/07025; H01L 2924/0603; H01L 2225/06; H01L 2225/531; H01L 2225/06531; H01L 2225/06541; H01L 2224/04042; H01L 2224/48106; H02M 2003/071; H02M 2003/072; H02M 2003/075; H02M 2003/076; H02M 2003/077; H02M 2003/078
USPC ........................................................ 327/530
See application file for complete search history.

(56) References Cited

U.S. PATENT DOCUMENTS 8,674,486 B2 * 3/2014 Haigh ............... H01L 23/49503
257/676
9,514,879 B2 * 12/2016 Pagani ................ H04B 5/0012
(Continued)

OTHER PUBLICATIONS

"CMOS Digital Isolators Supersede Optocouplers in Industrial Applications", Silicon Laboratories, Inc., 18 pages.
(Continued)

*Primary Examiner* — Patrick Chen
(74) *Attorney, Agent, or Firm* — Sheridan Ross P.C.

(57) ABSTRACT

A capacitive isolation system, capacitive isolator, and method of operating the same are disclosed. The capacitive isolation system is described to include a first semiconductor die and a second semiconductor die each having capacitive elements established thereon and positioned in a face-to-face configuration. An isolation layer is provided between the first and second semiconductor die so as to establish an isolation boundary therebetween. Capacitive coupling is used to carry information across the isolation boundary.

30 Claims, 19 Drawing Sheets

(51) Int. Cl.
  *H01L 23/00* (2006.01)
  *H01L 25/065* (2006.01)
  *H01L 23/60* (2006.01)
  *H01L 23/58* (2006.01)
  *H01L 23/48* (2006.01)
  *H01L 23/495* (2006.01)
  *H01L 23/522* (2006.01)
  *H01L 23/31* (2006.01)

(52) U.S. Cl.
  CPC .......... H01L 25/0657 (2013.01); H02M 1/32 (2013.01); *H01L 23/49551* (2013.01); *H01L 24/48* (2013.01); *H01L 2224/04042* (2013.01); *H01L 2224/0603* (2013.01); *H01L 2224/48091* (2013.01); *H01L 2224/48106* (2013.01); *H01L 2224/48247* (2013.01); *H01L 2224/48257* (2013.01); *H01L 2225/0651* (2013.01); *H01L 2225/06562* (2013.01); *H01L 2225/06575* (2013.01); *H01L 2924/00014* (2013.01); *H01L 2924/07025* (2013.01); *H01L 2924/172* (2013.01); *H01L 2924/1711* (2013.01); *H01L 2924/3025* (2013.01); *H01L 2924/386* (2013.01)

(56) References Cited

U.S. PATENT DOCUMENTS

| | | |
|---|---|---|
| 2007/0141776 A1 | 6/2007 | Chen et al. |
| 2008/0185682 A1 | 8/2008 | Alter |
| 2013/0001738 A1* | 1/2013 | Dong ................ H01L 23/49575 257/508 |
| 2014/0162552 A1 | 6/2014 | Barrenscheen et al. |
| 2017/0103969 A1* | 4/2017 | Krause ................ H01L 25/0657 |

OTHER PUBLICATIONS

Fandrich, Cory Lynn, "An On-Chip Transformer-Based Digital Isolator System", University of Tennessee, 2013, 68 pages.

\* cited by examiner

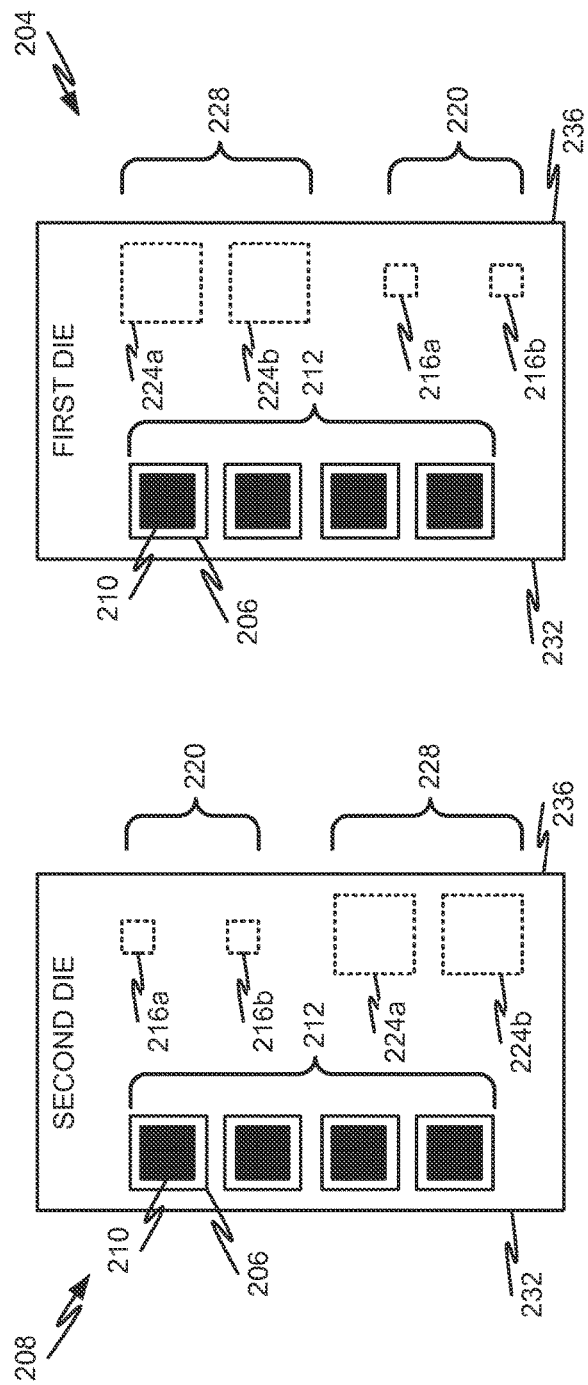
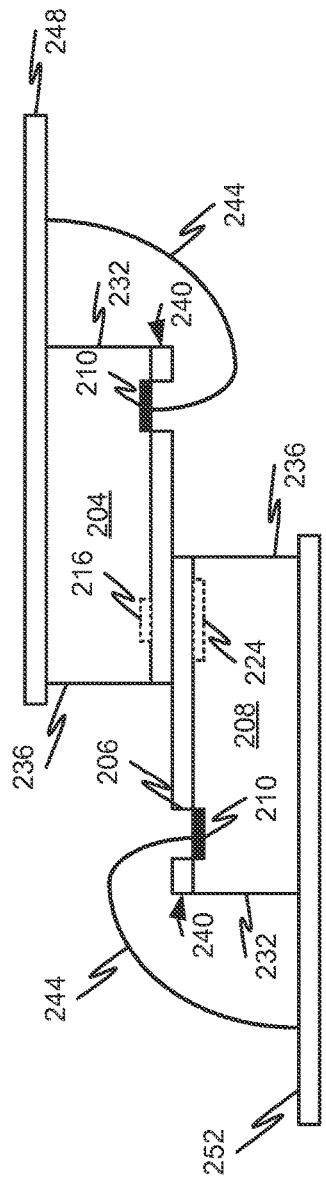
FIG. 2A
FIG. 2B

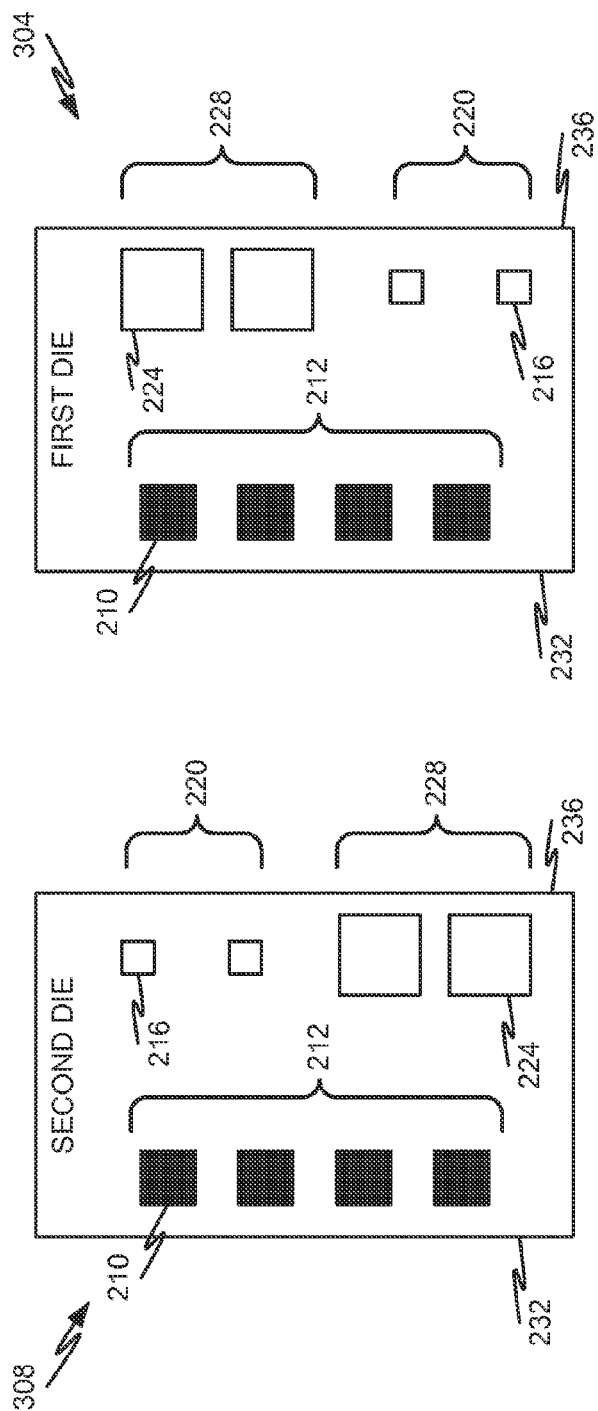
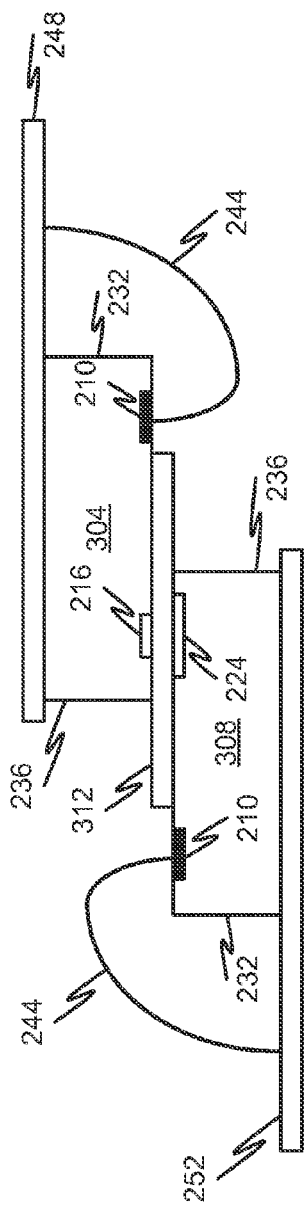
FIG. 3A
FIG. 3B

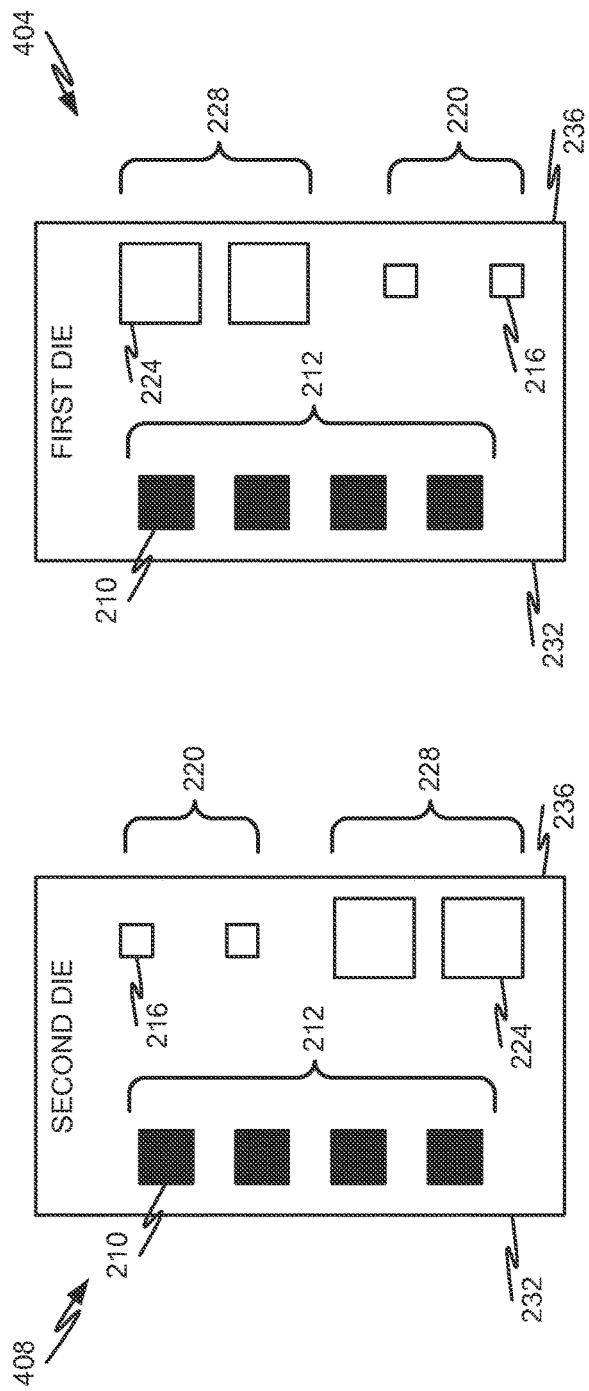
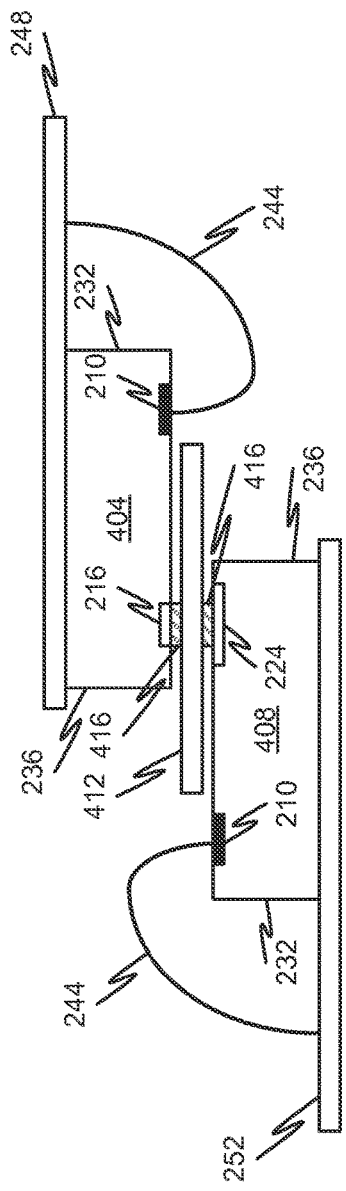
FIG. 4A
FIG. 4B

`US 9,960,671 B2`

ISOLATOR WITH REDUCED SUSCEPTIBILITY TO PARASITIC COUPLING

FIELD OF THE DISCLOSURE

The present disclosure is generally directed toward electronic isolation and devices for accommodating the same.

BACKGROUND

There are many types of electrical systems that benefit from electrical isolation. Galvanic isolation is a principle of isolating functional sections of electrical systems to prevent current flow, meaning that no direct electrical conduction path is permitted between different functional sections. As one example, certain types of electronic equipment require that high-voltage components (e.g., 1 kV or greater) interface with low-voltage components (e.g., 10V or lower). Examples of such equipment include medical devices and industrial machines that utilize high-voltage in some parts of the system, but have low-voltage control electronics elsewhere within the system. The interface of the high-voltage and low-voltage sides of the system relies upon the transfer of data via some mechanism other than electrical current.

Other types of electrical systems such as signal and power transmission lines can be subjected to voltage surges by lightning, electrostatic discharge, radio frequency transmissions, switching pulses (spikes), and perturbations in power supply. These types of systems can also benefit from electrical isolation.

Electrical isolation can be achieved with a number of different types of devices. Some examples of isolation products include galvanic isolators, opto-couplers, inductive, and capacitive isolators. Previous generations of electronic isolators used two chips in a horizontal configuration with wire bonds between the chips. These wire bonds provide a coupling point for large excursions in the difference between the grounds of the systems being isolated. These excursions can be on the order of 25,000 V/usec.

As mentioned above, electrical isolation can be achieved with capacitive, inductive isolators, and/or RF isolators to transmit data across an isolation boundary. The capacitive approach may employ a small capacitor, say 100 fF across the isolation boundary. For the receiver to discern logic level swings differentiated across the isolation boundary, the receiver needs to detect the transmitted signal in the presence of large excursions that have roughly the same bandwidth of interest.

Prior capacitive isolators use a planar package design in which two chips are separated in the horizontal direction and the coupling device is connected via chip-to-chip wire bond(s). The prior solutions may have the coupling device integrated into the receiver or they may employ a third chip that has the coupling device. In either scenario, the wire bond acts like an antenna with about 1-2 nH of inductance. This inductor is suspended over the isolation boundary and has a certain coupling to the ground planes of both chips. Since most couplers are differential, there are at least two of these wire bonds. If the coupling to these wire bonds is not balanced, then the large common mode rejection excursions (e.g., 1000V at rate of 25,000V/usec) will turn into differential voltages via this unbalanced coupling.

It would be desirable to employ a capacitive isolator that minimizes the coupling to this node by removing the wire bonds and making this node as short as possible. It would also be desirable to achieve these goals without increasing production costs to the point where high-volume production is not feasible.

BRIEF DESCRIPTION OF THE DRAWINGS

The present disclosure is described in conjunction with the appended figures, which are not necessarily drawn to scale:

FIG. 2A is a top view of a first example of two dies used in a capacitive isolation system prior to placement of the dies into an operating position in accordance with embodiments of the present disclosure;

FIG. 2B is a cross-sectional side view of the two dies from FIG. 2A placed in an operating position in accordance with embodiments of the present disclosure;

FIG. 3A is a top view of a second example of two dies used in a capacitive isolation system prior to placement of the dies into an operating position in accordance with embodiments of the present disclosure;

FIG. 3B is a cross-sectional side view of the two dies from FIG. 3A placed in an operating position in accordance with embodiments of the present disclosure;

FIG. 4A is a top view of a third example of two dies used in a capacitive isolation system prior to placement of the dies into an operating position in accordance with embodiments of the present disclosure;

FIG. 4B is a cross-sectional side view of the two dies from FIG. 4A placed in an operating position in accordance with embodiments of the present disclosure;

DETAILED DESCRIPTION

Figure 1:
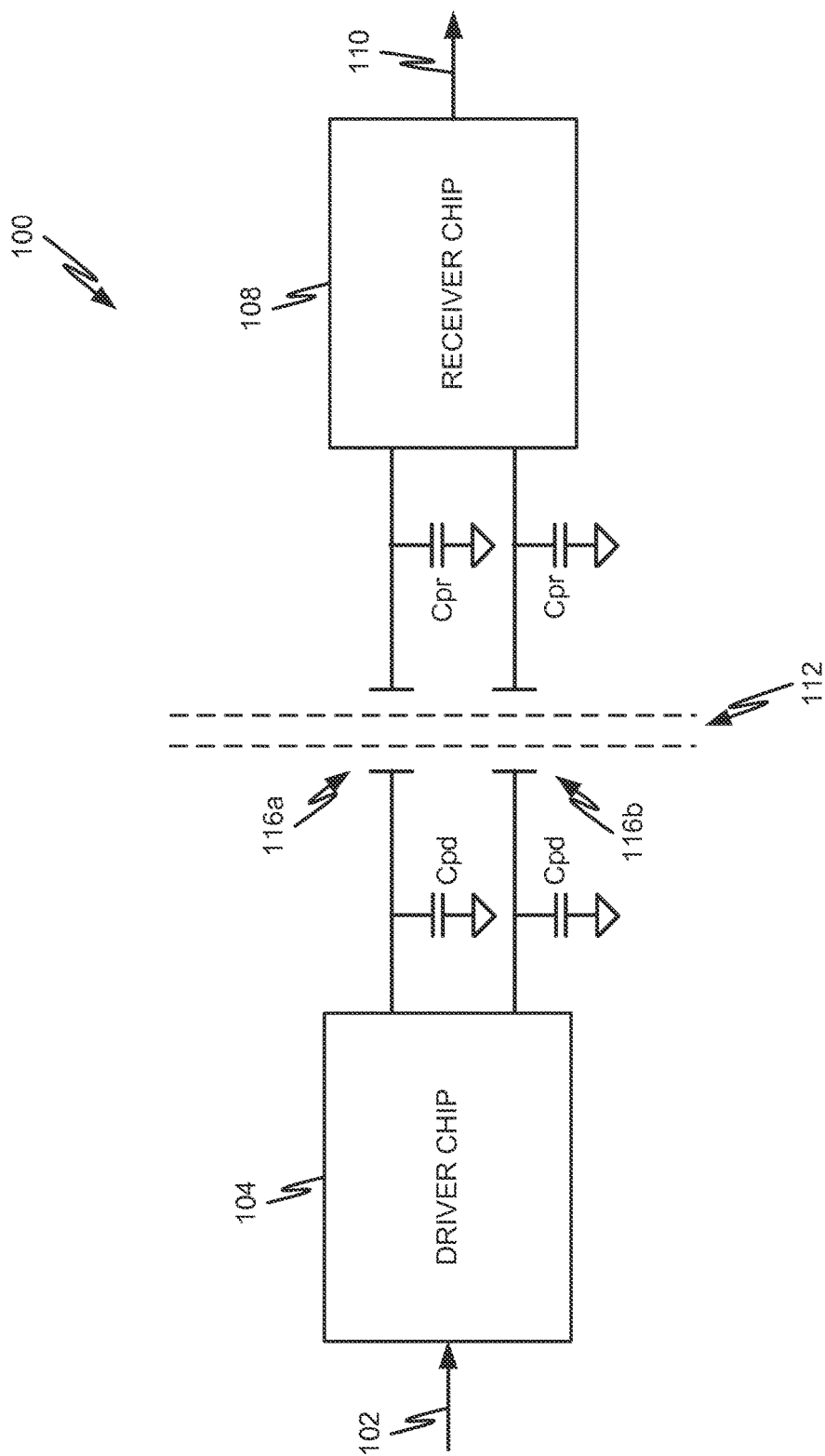
FIG. 1 is a schematic block diagram depicting a first capacitive isolation system in accordance with embodiments of the present disclosure.

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Furthermore, various descriptive terms used herein, such as "transparent" should be given the broadest meaning possible within the context of the present disclosure. For example, something that is described as being "transparent" should be understood as having a property allowing no significant obstruction or absorption of electromagnetic radiation in the particular wavelength (or wavelengths) of interest, unless a particular transmittance is provided.

Referring now to FIGS. 1-15, various configurations of isolation systems, isolators, isolation devices, and intermediate isolator configurations are depicted and described. Although some of the isolation systems depicted in the figures correspond to isolation systems of components thereof at intermediate stages of manufacturing (or in disassembled states), one of ordinary skill in the art will appreciate that any of the intermediate products herein can be considered an isolator or isolation system without departing from the scope of the present disclosure. In some embodiments, the isolators described herein may be incorporated into any system which requires current and/or voltage monitoring, but is susceptible to transients. In some embodiments, the isolation system in which an isolator described herein is rated to operate at about 5 kV, 10 kV, or more. Stated another way, the input side (e.g., a high-voltage side) of the isolator or isolation system may be directly connected to a 5 kV, 10 kV, 15 kV or greater source without damaging the isolator or any electronic devices attached to the output side (e.g., a low-voltage side) of the isolator. Accordingly, an isolation system which employs one or more of the isolators disclosed herein may be configured to operate in high-voltage or high-current systems but may also be configured to separate the high-voltage or high-current systems from a low-voltage or low-current system.

Referring now to FIG. 1, a first capacitive isolation system 100 will be described in accordance with at least some embodiments of the present disclosure. The system 100 is shown to include a driver chip 104 and a receiver chip 108 separated by an isolation boundary 112. In some embodiments, the driver chip 104 may also behave as a receiver chip 108 and the receiver chip 108 may behave as a driver chip 104 during certain times or when information is to be communicated from the chip 108 to chip 104. In other words, both chips may operate as drivers and receivers without departing from the scope of the present disclosure.

The driver chip 104 may be operating in a high-voltage environment (e.g., with a ground potential at or exceeding 1 kV) whereas the receiver chip 108 may be operating in a low-voltage environment. Of course, the opposite condition may also be true without departing from the scope of the present disclosure. The isolation boundary 112 may provide the mechanism for protecting the low-voltage environment from the high-voltage environment. It should be appreciated, however, that the receiver chip 108 may be operating in the high-voltage environment and the driver chip 104 may be operating in the low-voltage environment.

For ease of discussion, the driver chip 104 will be explained as a component that is connected to a circuit (e.g., an input circuit) whose current and/or voltage is being measured and by the receiver chip 108 at an output circuit. The isolation boundary 112 is provided to electrically insulate the currents/voltages at the input circuit from the output circuit.

In some embodiments, the driver chip 104 receives an input signal 102 from the input circuit and communicates the input signal 102 across the isolation boundary 112 to the receiver chip 108. The receiver chip 108 then generates an output signal 110 that is transmitted to further circuitry. The output signal 110 may correspond to a logical representation or copy of the input signal 102. The output signal 110 is essentially a reproduction of the input signal 102 on different circuitry and at a different potential.

Communication of the input signal 102 across the isolation boundary is achieved by one or more isolation capacitors 116. Although the plates/pads of one or more capacitors 116 on the driver chip side are shown as being approximately the same size as the plates/pads of the one or more capacitors 116 on the receiver chip side, it should be appreciated that the pads of the capacitor may not necessarily be of the same size. As a non-limiting example, the plate/pad on the driver chip side may be larger than the plate/pad on the receiver chip side, or vice versa. Said another way, embodiments of the present disclosure are not limited to the illustrative system 100 and the sizes of the components depicted therein. Additionally, although both the driver chip 104 and receiver chip 108 are shown to be using the same ground, it should be appreciated that the chips 104, 108 may not necessarily, and often will not, use the same ground or common potential.

In the embodiment of FIG. 1, a first and second isolation capacitor 116a, 116b are used to communicate the input signal 102 across the isolation boundary 112. In some embodiments, the first isolation capacitor 116a may correspond to a capacitor that communicates information from the driver chip 104 to the receiver chip 108 across the isolation boundary 112. The second isolation capacitor 116b may correspond to a capacitor that communicates information from the receiver chip 108 to the driver chip 104 across the isolation boundary 112. Accordingly, the first isolation capacitor 116a may also be referred to herein as the transmitting isolation capacitor whereas the second isolation capacitor 116b may also be referred to herein as the receiving isolation capacitor. The first isolation capacitor 116a may be included in a driver circuit of the isolation system 100 whereas the second isolation capacitor 116b may be included in a receiver circuit of the isolation system 100.

FIG. 1 further depicts other capacitors that are connected to ground on both the driver and receiver circuits. The capacitors to ground represent the parasitic capacitors that are inherently found on the driver and receiver circuits. Embodiments of the present disclosure aim to eliminate the sources of unequal coupling of a Common Mode-Rejection (CMR) event into the isolation capacitors 116a, 116b.

Currently-available capacitive isolation systems have the capacitors being wire bonded to circuits on one or both sides of the capacitor. This wire bonding actually helps couple a CMR event into the capacitors and, as such, creates the potential for a CMR event to be transformed into a differential signal that is indistinguishable from the desired informational signal. An ideal capacitive coupler as depicted in FIG. 1 will preferably exhibit little conductor area between the capacitor and the receiver/driver circuits. In applications in which the capacitor is fabricated on the receiver silicon, the bottom plate of the capacitor is the input of the receiver and is realized in a lower level conductor, which is usually well or island. In such a configuration, the parasitic capacitance of the receiver side, Cpr, and parasitic capacitance of the driver side, Cpd, is quite large compared to the isolation capacitors 116a, 116b. Specifically, the parasitic capacitance inherent to a die (e.g., between the plate and the leadframe) is larger (e.g., 10 times larger) than the capacitance between the first die and second die (e.g., size of the isolation capacitor 116a, 116bCiso). This means that most of the input signal 102 is lost to parasitic capacitance.

These isolation capacitors form a voltage divider with the input signal 102 and cause the receiver sensitivity to have to be increased to recover the transmitted signal. As will be discussed in further detail herein, embodiments of the present disclosure aim to create the capacitive elements 116a, 116b (isolation capacitors) by using organic tape, spin-on material, or the like and then placing the plates of the capacitive elements in face-to-face contact. Examples of such physical configurations are further depicted and described in connection with FIGS. 2A-4B.

Figure 2C:
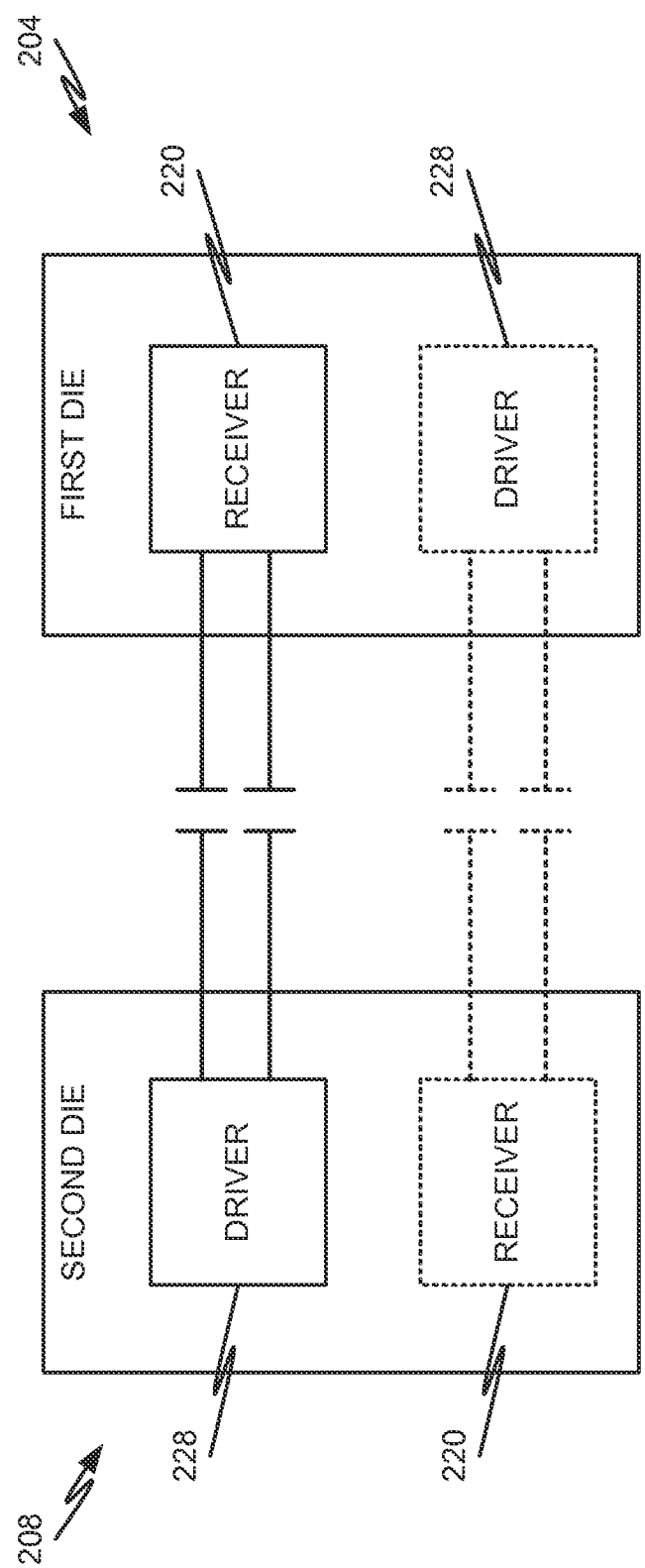
FIG. 2C is a schematic circuit diagram depicting the two dies from FIGS. 2A and 2B.

Referring initially to FIGS. 2A-2C, a first example of two dies 204, 208 used in a capacitive isolation system 100 will be described in accordance with embodiments of the present disclosure. FIG. 2A depicts the two dies 204, 208 from above prior to placement of the dies 204, 208 into an operating position in accordance with embodiments of the present disclosure. FIG. 2B shows the two dies 204, 208 placed in a face-to-face orientation, thereby creating an example of a capacitive isolator. The dies 204, 208 may correspond to semiconductor dies manufactured using silicon-based manufacturing techniques. The dies 204, 208 may have one or many layers that enable the dies 204, 208 to carry an electrical signal received from an external contact (e.g., a bonding pad 210) to a capacitive element (e.g., capacitive elements or plates 216, 224). Although the details of the dies 204, 208 are not depicted herein, it should be appreciated that any type of semiconductor die may be used in accordance with embodiments of the present disclosure.

As used herein, the bonding pad 210 and/or capacitive elements 216, 224 may be embodied as a number of different structures. In some embodiments, the term "capacitive element", "capacitive element", and "capacitive plate" may be used interchangeably to refer to one or multiple structures in a die 204, 208 that provide the capacitive functionality described herein. These capacitive elements may correspond to a metal plate or layer of metallic material having a defined area. In other embodiments, a capacitive element may correspond to a metal plate with some opening (e.g., without passivation) and a protective circuit positioned below for a bond or probe. A capacitive element, as used herein, may alternatively or additionally correspond to a simple metal plate (e.g., gold, silver, copper, tin, etc.) or a non-metal plate, such as a polysilicon layer. In other words, any of the capacitive elements described and claimed herein may correspond to a traditional metal area of material or a polysilicon layer of material. The metal layer may or may not be covered by a passivation layer.

Furthermore, although not depicted, it should be appreciated that each die 204, 208 may comprise internal driver circuitry (e.g., digital circuit components formed in silicon). In some embodiments, the driver circuitry is not located beneath either the bonding pads 210 or the capacitive elements 216, 224. In some embodiments, the driver circuitry can be located beneath the capacitive elements 216, 224 without departing from the scope of the present disclosure. In particular, if reduction of die size is desired, then the driver circuitry may be placed beneath the transmitting capacitive elements 224.

As can be appreciated, the first die 204 may correspond to one of the driver chip 104 or receiver chip 108 and the second die 208 may correspond to the other of the driver chip 104 or receiver chip 108. The first and second dies 204, 208 may be formed from a common piece of silicon or separate pieces of silicon. In the depicted embodiment, the first die 204 and second die 208 each have isolation layers 240 formed thereon. The isolation layers 240 formed on each chip may be provided as a thin film of polyimide or the like that is formed on the entirety of the top surface of the first and second die 204, 208. In some embodiments, the polyimide film is spun onto the top surface of the silicon forming the dies 204, 208. Moreover, the thickness of the spin-on polyimide formed on each die 204, 208 may be between 10 um and 40 um, with a preferred thickness of 12.5 um per-die. Thus, with each die 204, 208 have a 12.5 um thick film 240 formed thereon, an isolation boundary 112 created by the isolation layers 240 may be on the order of 25.0 um.

In the embodiment of FIGS. 2A-2C, since the isolation layer 240 extends to the outer boundaries of the top surface of the dies 204, 208, the film 240 further includes a plurality of openings 206. Each of the openings 206 expose bonding or contact pads 210 for each die 204, 208. In some embodiments, the bonding pads 210 are used to connect one or more bond wires 244 between the dies 204, 208 and lead frames 248, 252. In other words, without exposing the bonding pads 210, it is difficult to establish a direct electrical connection between the lead frames of the isolator and the silicon dies 204, 208. Thus, the openings 206 are established in the isolation layer 240 with an area at least as large as the area of the bonding pads 210.

The bonding pads 210 may correspond to a direct-connect portion 212 of the die 204, 208, meaning that bond wires 244 can be directly connected to the dies 204, 208 via the bonding pads 210. In some embodiments, the direct-connect portion 212, including the bonding pads 210 can be positioned asymmetrically on the top of the die 204, 208 with a bias toward a wire side 232 of the die 204, 208. The wire side 232 of each die 204, 208 may correspond to a side of the die 204, 208 that is nearest the lead frame 248, 252, thereby allowing for a shorter bond wire 244.

The opposite side of the die 204, 208 may correspond to a capacitor side 236. The capacitor side 236 of the die 204, 208 may comprise one or more drive isolation capacitor components and one or more receive isolation capacitor components. Specifically, each die 204, 208 may comprise a drive portion 228 and a receive portion 220. As shown in FIG. 2A, the drive portion 228 of one die (e.g., first die 204) may be positioned at a top portion of the die whereas the drive portion 228 of the other die (e.g., the second die 208) may be positioned at a bottom portion of the die. Likewise, a receive portion 220 of one die (e.g., first die 204) may be positioned opposite the drive portion 228 (e.g., at a bottom portion of the die). This means that when one die is turned upside down and placed in a face-to-face configuration with the other die, the drive portion 228 of one die is directly opposite to the receive portion 220 of the other die.

In some embodiments, the drive portion 228 of each die 204, 208 may comprise one or more transmitting capacitive elements 224 and the receive portion 220 may comprise one or more receiving capacitive elements 216. In the depicted embodiment, each die 204, 208 comprises a first receiving capacitive element 216a and a second receiving capacitive element 216b for the receive portion 220. Each die 204, 208 is also depicted as having a first transmitting capacitive element 224a and a second transmitting capacitive element 224b for the drive portion 228. The bonding pads 210, receiving capacitive elements 216, and transmitting capacitive elements 224 may all be formed on the top surface of the die 204, 208. Some or all of these pads may be formed with one or more of a metal, poly, or diffusion. In some embodiments, the pads (e.g., bonding pads 210, receiving capacitive elements 216, and transmitting capacitive elements 224) are formed on the top most layer of metal in the IC-formation process. By placing the bottom plate as high as possible in the oxide stack, the parasitic capacitances, Cpd and Cpr, are minimized. The driver parasitic capacitance Cpd could be larger and, as such, the transmitting capacitive elements 224a, 224b could be lower in the oxide stack due to the low impedance of this node. The receiving capacitive elements 216a, 216b, which is most sensitive to parasitic capacitances, is used to define the capacitor (e.g., capacitor size in Farads and area) when the two dies 204, 208 are placed face-to-face.

In some embodiments, the transmitting capacitive element 224a, 224b is enlarged as compared to the receiving capacitive elements 216a, 216b to compensate for alignment mismatch due to the chip placement tolerance relative to each other in the face-to-face configuration. The thickness of the isolation layer 240 is a tradeoff between the desire to have a thin isolation layer 240, thereby increasing the value/size of the isolation capacitors 116a, 116b formed by the transmitting and receiving capacitive elements with the need to have a thick isolation layer 240, thereby increasing the isolation voltage rating of the isolator.

When the isolation layer 240 is applied/formed on top of the die 204, 208, the capacitive elements 216, 224 may be covered. As mentioned above, the bonding pads 210 are exposed through the isolation layer 240 via openings 206 that coincide with the bonding pads 210.

When configured in a face-to-face orientation, the first receiving capacitive element 216a of one die 204, 208 at least partially overlies the first transmitting capacitive element 224a of the other die 204, 208. This at least a partial overlap may correspond to a full overlap (e.g., a 100% overlap). Alternatively, at least a partial overlap may correspond to at least a 90% overlap, at least a 70% overlap, or some other percentage of overlap, which may be dependant upon manufacturing tolerances and/or design requirements. The second receiving capacitive element 216b of one die 204, 208 also at least partially overlies the second transmitting capacitive element 224b of the other die 204, 208. When positioned in such an overlapping relationship (e.g., at least partial overlapping arrangement), the isolation capacitors 116a, 116b are formed. FIGS. 2A and 2B also exhibit a scheme for ensuring that alignment issues during manufacturing are accommodated. Specifically, the receiving capacitive elements 216 are shown to have an area less than the transmitting capacitive elements 224. The ideal placement of one die relative to the other die would result in the center of the receiving capacitive elements 216 aligning with the center of the transmitting capacitive elements 224. However, such ideal placement may not always occur during actual manufacturing, especially when isolators are being produced in high-volumes.

As can be appreciated, the lead frames 248, 252 supporting the dies 204, 208 may correspond to metal lead frames that also connect the dies to external circuitry, such as a Printed Circuit Board (PCB) or the like. The lead frames may include a first lead frame portion 248 for connecting with the first die 204 and a second lead frame portion 252 for connecting with the second die 208. The second lead frame portion 252 may receive the input signal 102 and, therefore, may be connected to an input side of the isolation system while the first lead frame portion 248 may provide the output signal 110 and, therefore, may be connected to an output side of the isolation system. It should be appreciated that the lead frame portions 248, 252 may be conductive elements and have one or more leads. Examples of materials that can be used to form the lead frame portions 248, 252 include, without limitation, metal (e.g., copper, silver, gold, aluminum, steel, lead, etc.), graphite, and/or conductive polymers. The lead frame portions 248, 252 may be manufactured using machining, micro-machining, stamping, or other such manufacturing techniques.

FIG. 2C shows a circuit diagram of the isolator of FIGS. 2A and 2B. In some embodiments, the first die 204 and second die 208 may comprise a receive portion 220 and/or a drive portion 228. FIG. 2C shows the optional configuration where each die comprises both a receive portion 220 and a drive portion 228. It should be appreciated that the first die 204 may comprise either a receive portion 220 only, a driver portion 228 only, or a combination of the two. The second die 208 may be configured to accommodate the configuration of the first die 204. As can be seen in FIG. 2C, multiple capacitive couplings may carry information from the drive portion 228 of one die to the receive portion 220 of the other die. These capacitive couplings may be similar in size/value or one capacitive coupling may be larger than the other. In some embodiments, the capacitive couplings are not a differential pair of capacitors.

With reference now to FIGS. 3A and 3B, another example of two dies 304, 308 used in a capacitive isolation system 100 will be described in accordance with embodiments of the present disclosure. FIG. 3A depicts the two dies 304, 308 from above prior to placement of the dies 304, 308 into an operating position in accordance with embodiments of the present disclosure. FIG. 3B shows the two dies 304, 308 placed in a face-to-face orientation, thereby creating an example of a capacitive isolator.

The dies 304, 308 are similar to the dies 204, 208 and share many similar or identical features therewith. A difference between dies 304, 308 and dies 204, 208 is that dies 304, 308 comprise a single isolation layer 312 between them when positioned in a face-to-face orientation. Specifically, instead of forming a polyimide layer for the isolation layer 240 on each die, a single isolation layer 312 is used to electrically isolate the first die 304 from the second die 308. In some embodiments, the single isolation layer 312 may comprise a similar thickness to the combined thicknesses of the isolation layers 240. As an example, the isolation layer 312 may comprise a thickness of about 1 mil. In some embodiments, a thicker isolation layer 312 (e.g., 2 mil) can be used, but such an isolation layer may decrease the size of the isolation capacitors 116a, 116b, especially with respect to the parasitic capacitances, Cpd and Cpr, thereby making the isolator less effective. As a more specific, but non-limiting example, the isolation layer 312 may correspond to a polyimide tape having silicone adhesives on both sides thereof. The polyimide tape may correspond to poly(4,4'-oxydiphenylene-pyromellitimide). In some embodiments, the polyimide tape is a self-supporting structure (e.g., capable of physically supporting its own weight) that can be cut to a specific dimension and then applied to a top surface of one of die 304, 308. Then the die 304, 308 may be positioned in a face-to-face configuration and the other side of the isolation layer 312 is pushed into contact with the top surface of the other die 304, 308.

Since a single isolation layer 312 is used and it not entirely covering the top surface of either die 304, 308, there is no need to establish openings 206 through the isolation layer 312. Instead, the isolation layer 312 may be configured to have a width that covers the overlapping regions of die 304, 308 without extending all the way to the bonding pads 210. As with the first configuration of die 204, 208, the die 304, 308 may not completely overlap one another. Instead, the wire sides 232 of the die 304, 308 may be positioned furthest away from one another while the capacitor sides 236 are overlapped by the other die 304, 308. Such a configuration exposes the bonding pads 210 for wire bonding to the lead frame portions 248, 252. Although wire bonding corresponds to one type of electrical connection mechanism, it should be appreciated that embodiments of the present disclosure contemplate other functionally-equivalent mechanisms such as probing or the like.

Again, the bonding pads 210, receiving capacitive elements 216, and transmitting capacitive elements 224 may be formed at or near the top of the die 304, 308. The receiving capacitive elements 216 of one die 304, 308 and transmitting capacitive elements 224 of the other die 304, 308 may be physically separated from one another to create the isolation capacitors 116a, 116b.

With reference now to FIGS. 4A and 4B, another example of two dies 404, 408 used in a capacitive isolation system 100 will be described in accordance with embodiments of the present disclosure. FIG. 4A depicts the two dies 404, 408 from above prior to placement of the dies 404, 408 into an operating position in accordance with embodiments of the present disclosure. FIG. 4B shows the two dies 404, 408 placed in a face-to-face orientation, thereby creating an example of a capacitive isolator.

In this particular construction, metallization is built on both sides of an isolation layer 412. Here the isolation layer 412 can again be embodied as a polyimide tape having adhesive on both sides thereof. The metallization on each side of the isolation layer 412 may be positioned to connect with the transmitting capacitive elements 224 and receiving capacitive elements 216 via gold stud bonding or solder bumps 416. In some embodiments, the metallization may be in the form of a metallic pad expanding an area substantially similar to the transmitting/receiving capacitive elements. An advantage to using this particular configuration is that the size of the isolation capacitors 116a, 116b is defined by the fine-line width process to manufacture the metallization on the isolation layer 412. This eliminates the turn over and placement tolerances of the assembly equipment. Again, the receiving capacitive element 216 on the die 404, 408 may be smaller than the transmitting capacitive element 224 on the die 404, 408; however, the size of the capacitor is defined by the size of the metallization. Standard manufacturing techniques such as thermosonic bonding can then be used to connect the top surface of each die 404, 408 to the metallization formed on the isolation layer 412.

As with other embodiments described herein, the isolation layer 412 may correspond to tape or a similar electrically-insulating material. The isolation layer 412 may correspond to 25 um or 50 um thick tape having silicone adhesive on both sides thereof.

Figure 5:
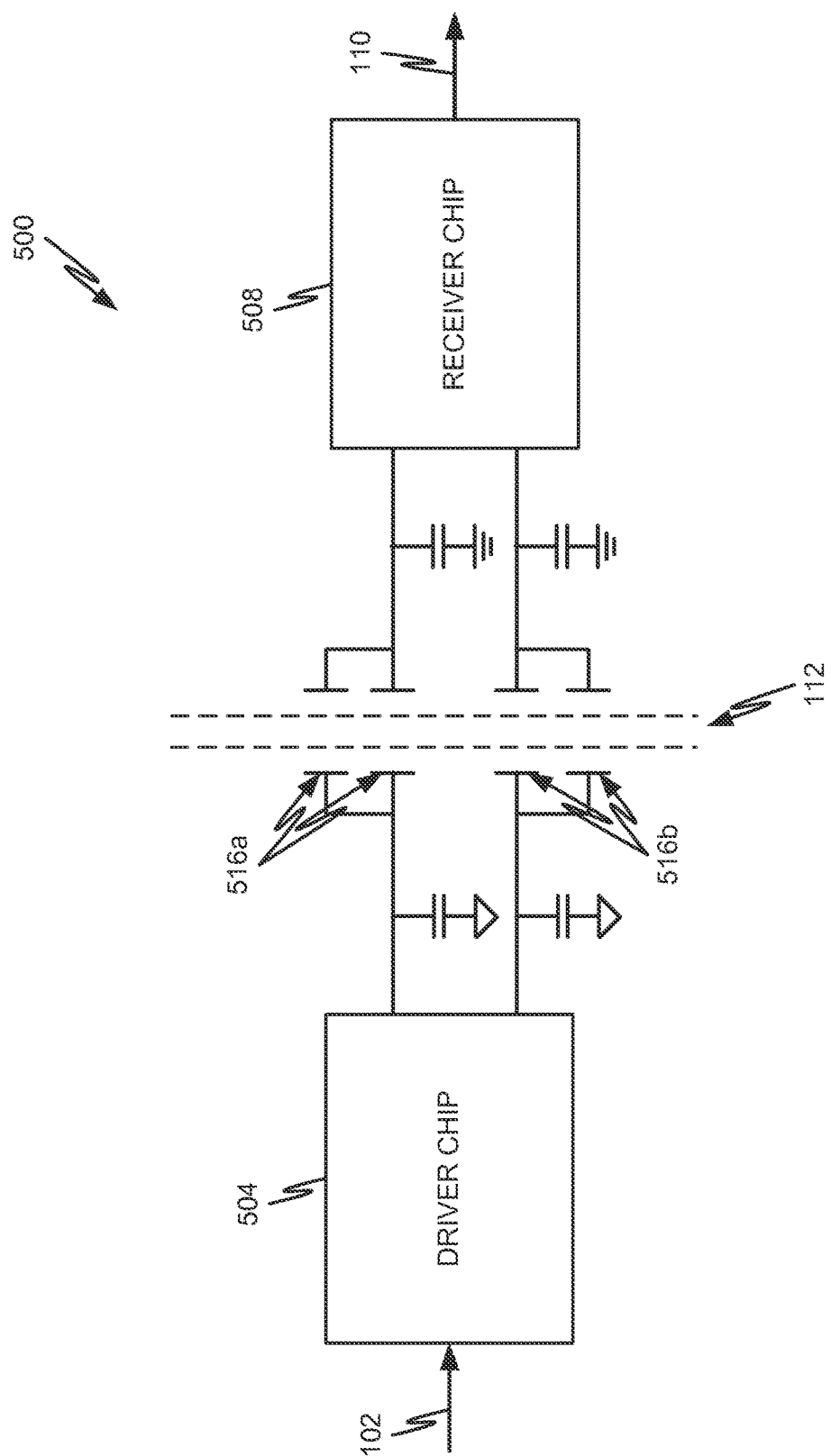
FIG. 5 is a schematic block diagram depicting a second capacitive isolation system in accordance with embodiments of the present disclosure.

With reference now to FIG. 5, a second example of a capacitive isolation system 500 will be described in accordance with at least some embodiments of the present disclosure. The capacitive isolation system 500 is similar to capacitive isolation system 100 in that both systems comprise an input signal 102, output signal 110, driver chip 504, receiver chip 508, and one or more isolation capacitors 516a, 516b that are used to transmit signals across an isolation boundary 112. The isolation capacitors 516a, 516b are different from isolation capacitors 116a, 116b in that the isolation capacitors 516a, 516b comprise multiple capacitive plates. FIG. 5 also shows a feature that may be shared with any other isolation system or isolator described herein. Specifically, the chips do not necessarily have to be connected to ground or a common voltage. Instead, each chip 504, 508 may use different grounds or common potentials without departing from the scope of the present disclosure.

Figure 6:
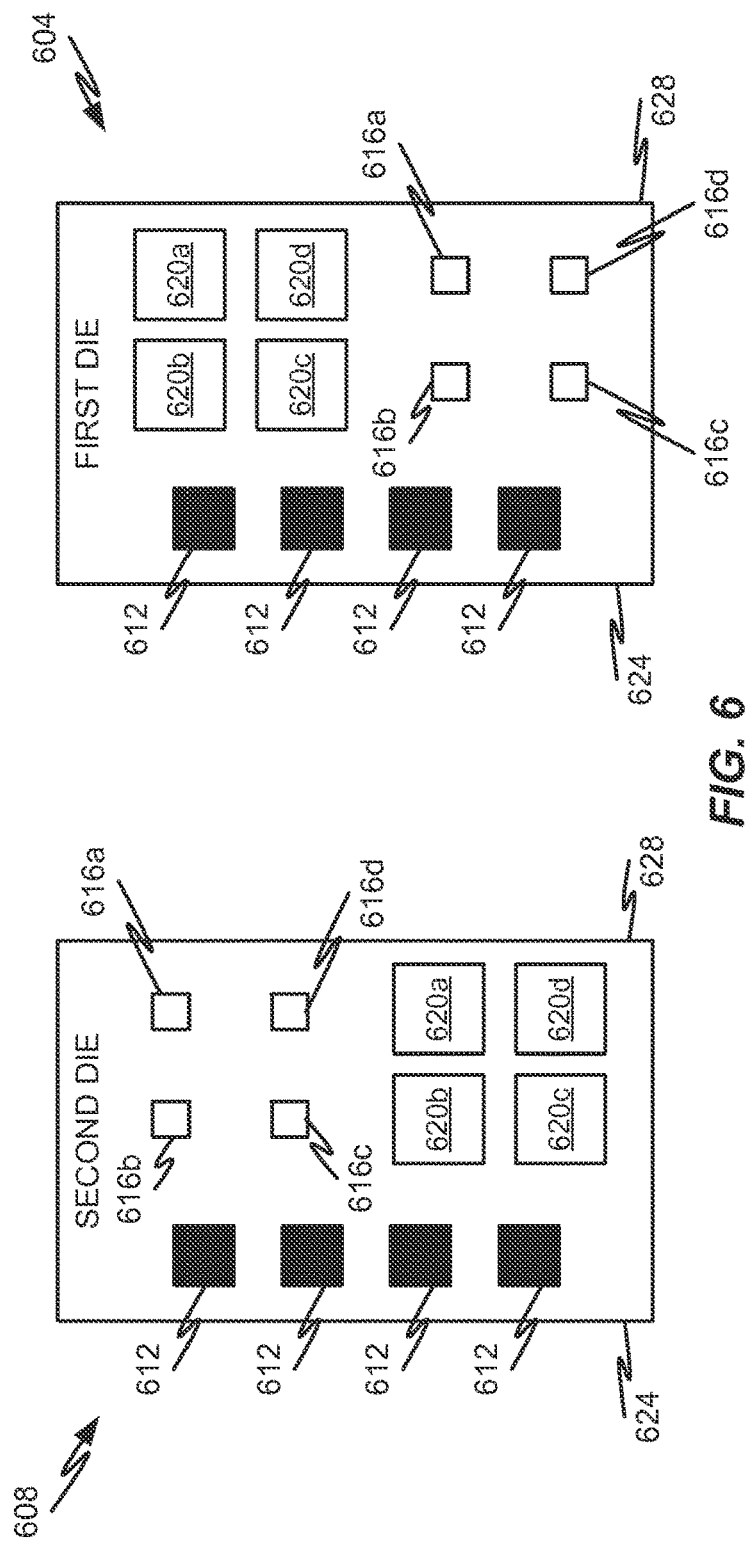
FIG. 6 is a top view of an example of two dies used in the second capacitive isolation system depicted in FIG. 5.

FIGS. 5 and 6 also show that the capacitors can be configured in a common centroid configuration. In particular, a center of mass of the set of transmitting capacitive elements on one die may be substantially aligned (within machining and/or manufacturing tolerances) with a center of mass of the set of receiving capacitive elements on the other die. For instance, FIG. 6 shows how a cluster of four transmitting capacitive elements have a center of mass that is aligned with a center of mass for the cluster of four receiving capacitive elements of the other die. As can be appreciated, trying to align these centers of mass to achieve a common centroid configuration is difficult and subject to manufacturing processes, which may make it difficult to achieve a perfect common centroid configuration. It should be appreciated that other embodiments depicted herein also show variants of a common centroid configuration. For instance, FIG. 3B shows a cluster of two capacitive elements having a center of mass that is substantially aligned with the center of mass of the opposing capacitive elements on the other die. A common centroid configuration can help to minimize interference and/or noise in the isolation system.

FIG. 6 depicts one non-limiting example of the capacitor construction that can be used to achieve the isolation capacitors 516a, 516b. While FIG. 6 shows an example of die 604, 608 not having an isolation layer formed directly thereon (e.g., as a film and as described in connection with FIGS. 2A and 2B) it should be appreciated that the die 604, 608 may be constructed in accordance with principles described in connection with any of FIGS. 2A through 4B. For simplicity, FIG. 6 shows die 604 having no isolation layer formed thereon.

The illustrative construction of each die 604, 608 again shows a receive portion and drive portion. Each die 604, 608 also exhibits one or more bonding pads 612 that are capable of being wire bonded to a lead frame supporting the die. The illustrative die 604, 608 comprise a plurality of isolation capacitors 516a, 516b, each being formed with two or more individual capacitive plate pairs that are connected in parallel with one another.

Although the receive and drive portions are shown to include four capacitive elements each, it should be appreciated that a greater or lesser number of capacitive elements may be included in each portion. In some embodiments, the number of capacitive elements on a drive portion of one die should match the number of capacitive elements on a receive portion of the other die, and vice versa. It is not a requirement, however, that a single die have the same number of transmitting capacitive elements and receiving capacitive elements.

Each die 604, 608 is shown to include a first, second, third, and fourth receiving capacitive element 616a, 616b, 616c, 616d, respectively, as well as a first, second, third, and fourth transmitting capacitive element 620a, 620b, 620c, 620d, respectively. When placed into a face-to-face orientation, the first receiving capacitive element 616a of one die may overlap with the second transmitting capacitive element 620b of the other die. Similarly, the second receiving capacitive element 616b of one die may overlap with the first transmitting capacitive element 620a of the other die. Further still, the third receiving capacitive element 616c of one die may overlap with the fourth transmitting capacitive element 620d of the other die. For completeness, the fourth receiving capacitive element 616d of one die may overlap with the third transmitting capacitive element 620c of the other die. In this configuration, two or more parallel capacitors are established for the isolator capacitors 516a, 516b. As can be appreciated the common centroid configuration depicted in FIGS. 5 and 6 and the utilization of multiple parallel capacitors may help to avoid capacitor mismatch.

Figure 7A:
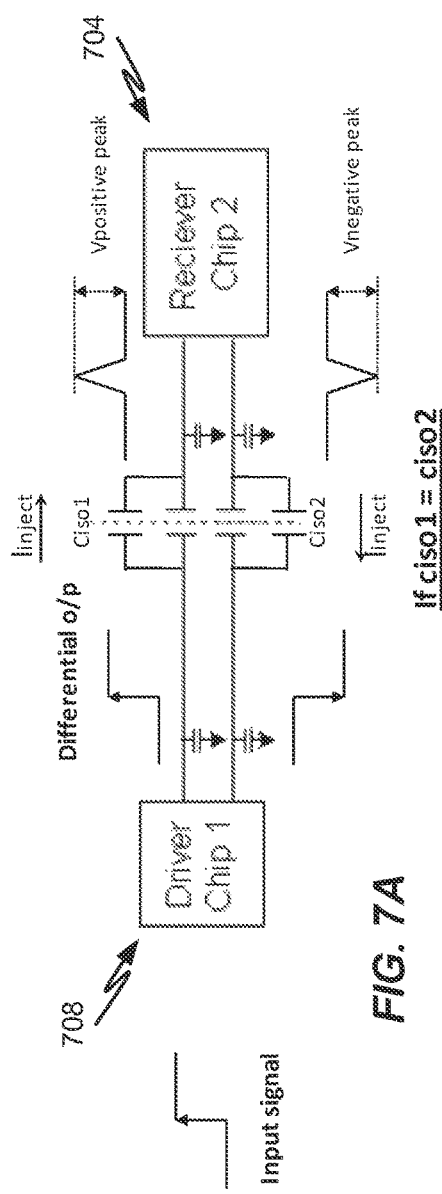
FIG. 7A is a schematic block diagram depicting input and output signals in a capacitive isolation system when the capacitance of each capacitor in the isolation system is approximately matched.

Referring now to FIGS. 7A through 7F, additional details of adaptive calibration for an isolation system will be described in accordance with at least some embodiments of the present disclosure. FIG. 7A depicts an ideal condition where the injection current flowing from the driver chip 708 to the receiver chip 704 approximately equals the injection current flowing from the receiver chip 704 to the driver chip 708. This will result in approximately the same Vpositive peak amplitude and Vnegative peak amplitude.

It should be appreciated, however, that manufacturing processes may be imperfect. Vertical and/or horizontal alignment mismatches due to misplacement of either chip 704, 708 will result in an isolation capacitor mismatch between the first isolation capacitor and second isolation capacitor. The imbalances on the isolation capacitors will produce an unwanted signal path when a CMR event occurs. A larger capacitor mismatch will produce a higher unwanted signal level, thereby lowering the CMR rating for the isolator.

Figure 7B:
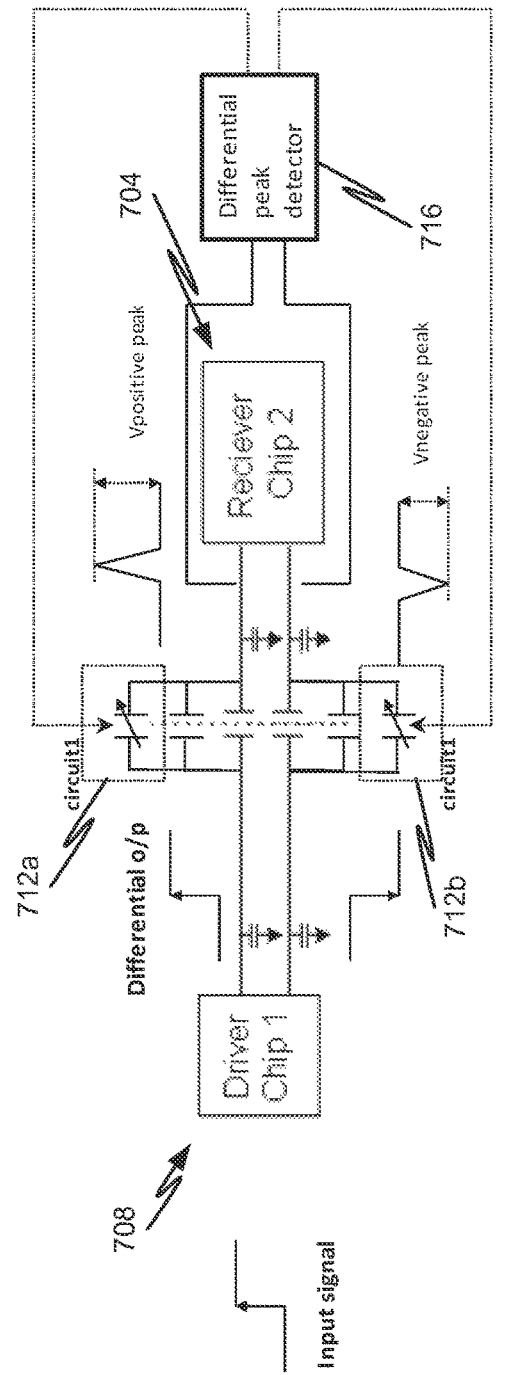
FIG. 7B is a schematic block diagram depicting input and output signals in a capacitive isolation system when the capacitance of one capacitor does not match the capacitance of another capacitor.

FIG. 7B depicts the scenario where some capacitor mismatch exists and the value of one isolation capacitor does not equal the value of another isolation capacitor. If the isolation capacitors are not equal, then the current injected from the driver chip 708 to the receiver chip 704 will be different from the current injected from the receiver chip 704 to the driver chip 708. This will result in Vpositive peak amplitude being different from Vnegative peak amplitude. For example, if the first isolation capacitor (e.g., the capacitor carrying injection current from driver chip 708 to receiver chip 704) is greater than the second isolation capacitor (e.g., the capacitor carrying injection current from the receiver chip 704 to the driver chip 708), then the Vpositive peak amplitude will be greater than the Vnegative peak amplitude. Conversely, if the value of the first isolation capacitor is less than the value of the second isolation capacitor, then the Vpositive peak amplitude will be less than the Vnegative peak amplitude. The differences in Vpositive peak amplitude and Vnegative peak amplitude can be leveraged to calibrate the isolation capacitors with the use of a differential peak detector 716 and one or more adjustable capacitive circuits 712a, 712b. Specifically, one or more additional spare capacitors in either a first adjustable capacitive circuit 712a or a second adjustable capacitive circuit 712b can be selective switched on the receive side of the capacitor until the value of the first isolation capacitor approximately equals the value of the second isolation capacitor (or the Vpositive peak amplitude approximately equals the value of the Vnegative peak amplitude).

Figure 7D:
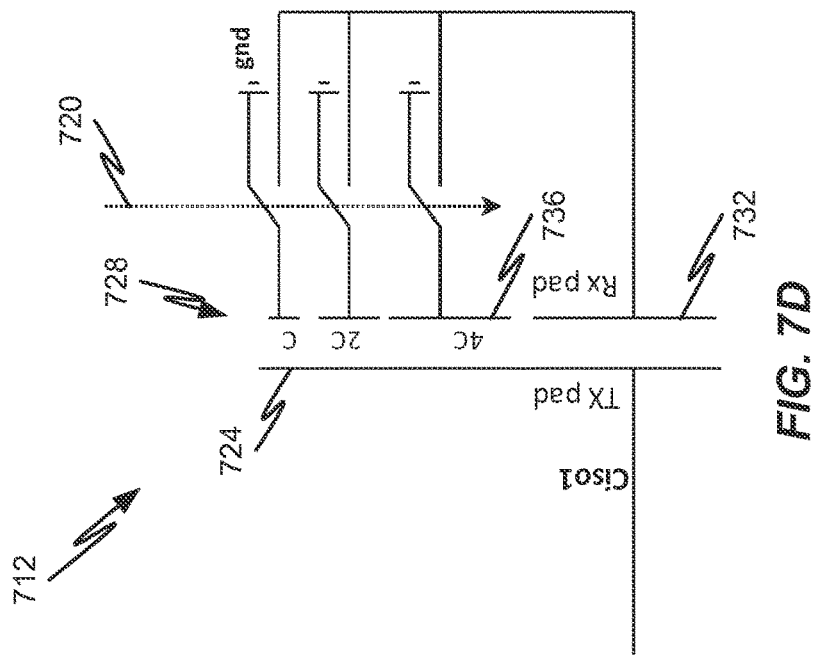
FIG. 7D is a schematic diagram depicting a second example of an adjustable capacitive circuit in accordance with embodiments of the present disclosure.
Figure 7C:
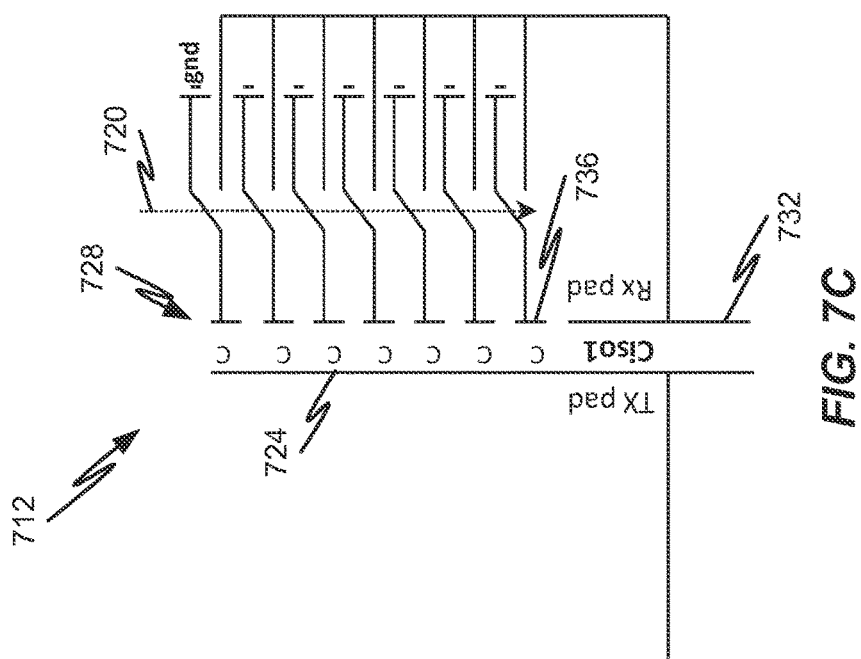
FIG. 7C is a schematic diagram depicting a first example of an adjustable capacitive circuit in accordance with embodiments of the present disclosure.

FIGS. 7C and 7D depict two examples of adjustable capacitive circuits 712 in accordance with at least some embodiments of the present disclosure. Although the adjustable capacitive circuits 712 shown possess a certain number of switchable capacitive portions, it should be appreciated that an adjustable capacitive circuit 712 may have one, two, three, . . . , twenty or more switchable capacitive portions, which may or may not be of the same size.

As discussed above, a differential peak detector 716 may be used to compare the Vpositive peak amplitude with the Vnegative peak amplitude and, based on such comparisons, provide one or more adjustment signals to the adjustable capacitive circuits 712a, 712b thereby switching on or off one or more switchable capacitive portions of the isolation capacitors. More specifically, an isolation capacitor may comprise a transmitting capacitive element 724 and a receiving capacitive element 728. The transmitting capacitive element 724 may be similar or identical to some or all of the transmitting capacitive elements already described herein. The receiving capacitive element 728 in the adjustable capacitive circuit 712 may be different from the other receiving capacitive elements described herein. Specifically, a receiving capacitive element 728 may comprise a main receiving portion 732 and a secondary receiving portion 736. The main receiving portion 732 may constitute the majority of the receiving capacitive element area whereas the secondary receiving portion 736 may constitute a minority of the receiving capacitive element area. In some embodiments, the combined area of the capacitive elements included in the secondary receiving portion 736 may comprise less than 1/10th the area of the main receiving portion 732.

In some embodiments, some or all of the capacitive elements included in the secondary receiving portion 736 may be dynamically switchable via one or several control switches 720. The control switches 720 may correspond to active switches in the receiver chip 704 and/or driver chip 708. Examples of such control switches 720 include, without limitation, transistors, MOSFETs (n-type or p-type), or the like. The actuation of the control switches 720 may be driven by the differential peak detector 716 that attempts to selectively switch on and/or off one or more receiving capacitive elements in the secondary receiving portion 736. By switching on and/or off the pads in the secondary receiving portion 736, the value of one or both isolation capacitors can be dynamically adjusted to accommodate variations in capacitance due to various operational conditions, manufacturing imperfections, and the like.

As seen in FIG. 7C, the receiving capacitive elements included in the secondary receiving portion 736 may be approximately the same size. As seen in FIG. 7D, the receiving capacitive elements in the secondary receiving portion 736 may be different sizes. The utilization of differently-sized receiving capacitive elements (e.g., of size C, 2C, 4C, etc.) can help in the capacitor-calibration process. In particular, if differently-sized capacitive elements are used, then calibration of the capacitance can be done in different scales where the larger capacitive element (e.g., of size 4C) is used for large adjustments and the smaller capacitive element(s) (e.g., of size C) are used for smaller adjustments. In other words, the smaller capacitive element(s) can be used for fine-grain calibration whereas the larger capacitive elements can be used for larger calibration adjustments.

Figure 7E:
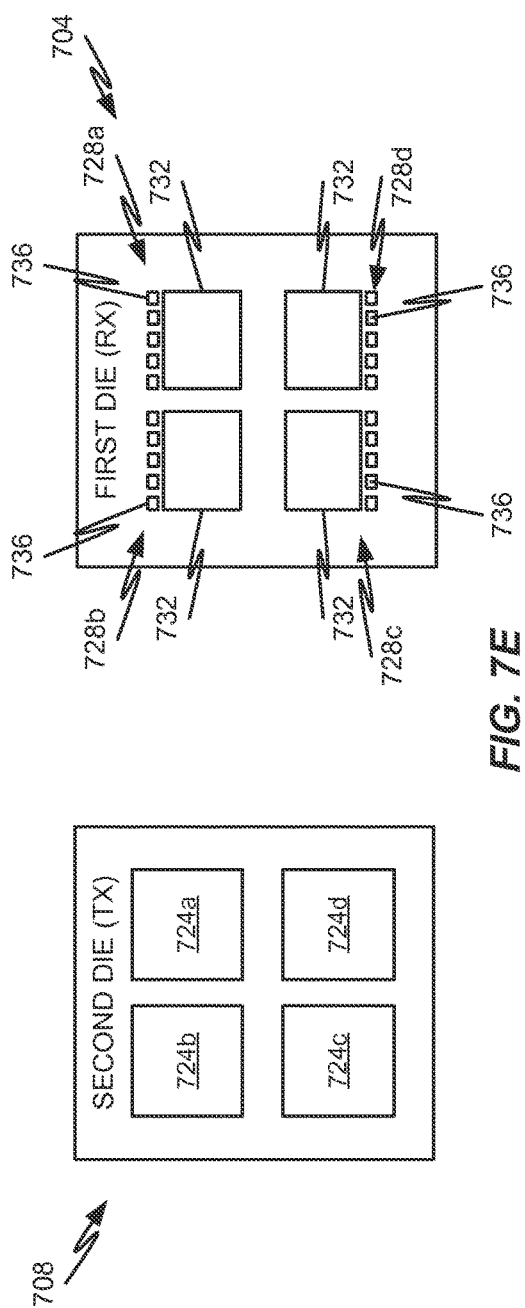
FIG. 7E is a top view of portions of a transmitter and receiver die used to implement an adjustable capacitive circuit in accordance with embodiments of the present disclosure.
Figure 7F:
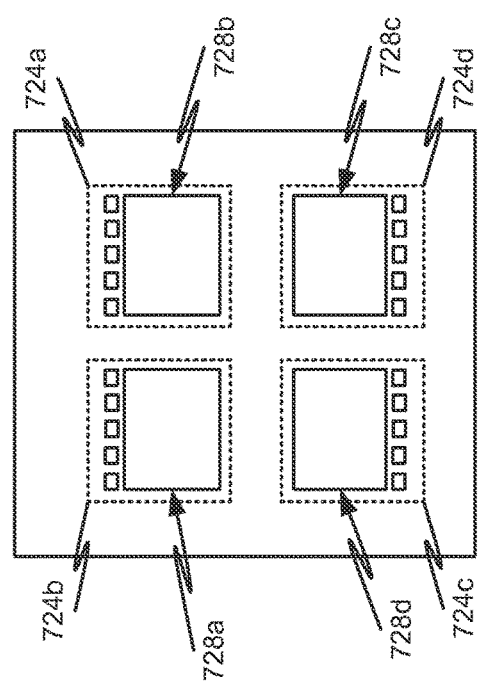
FIG. 7F is a top view of a transmitter die overlapping a receiver die in accordance with embodiments of the present discolsure.

FIGS. 7E and 7F show a general placement of the transmitting capacitive elements 724a-d that can be included in the transmitting side of a die 704, 708 as compared to placement of the receiving capacitive element 728. Specifically, the secondary receiving portion 736 may be located along a common side of the main receiving portion 732 or around a perimeter of the main receiving portion 732. As receiving capacitive elements in the secondary receiving portion 736 are switched on, the effective area of the receiving capacitive element 728 may be increased, thereby increasing the size of the isolation capacitor.

Although FIG. 7E only depicts a transmitting side of the driver chip 708 and a receiving side of the receiving chip 704, it should be appreciated that the chips 704, 708 may each comprise a transmitting and receiving portion, which may or may not be similar to one another. FIG. 7E also shows how the smaller receiving capacitive elements 728 are positioned in relation to the larger main receiving portion 732. In some embodiments, the smaller receiving pads 736 may have a size that is between about 2% and 10% the size of the main receiving portion 736. More specifically, the smaller receiving pads 736 may have a size that is between about 3% and 7% the size of the main receiving portion 736. In an even more specific embodiment, the smaller receiving pads 736 may have a size that is approximately 5% the size of the main receiving portion 736. Stated another way, the smaller receiving pads 736 may have a size on the order of 100 um to accommodate approximately 100 um manufacturing tolerances.

The smaller and multiple receiving capacitive elements 736 enable fine-grained calibration/tuning of the receiving capacitive element 728 to the transmitting capacitive element 724. Although FIG. 7E shows the smaller receiving pads 736 as being approximately the same size as one another, it should be appreciated that the smaller receiving pads 736 may be of different sizes/areas as shown in FIG. 7D. It should also be appreciated that the smaller receiving pads 736 may circumnavigate the entire main receiving portion 732 or they may reside adjacent to three or two sides of the main receiving portion 732 rather than just residing adjacent to a single side of the main receiving portion 732 as shown. It should also be appreciated that some of the smaller receiving pads 736 may have the same size, but contribute different capacitances as the capacitors can be formed on a bent lead frame, thereby causing the receiving capacitive elements 736 to be spaced apart from the transmitting capacitive element 724 by different distances.

Figure 8:
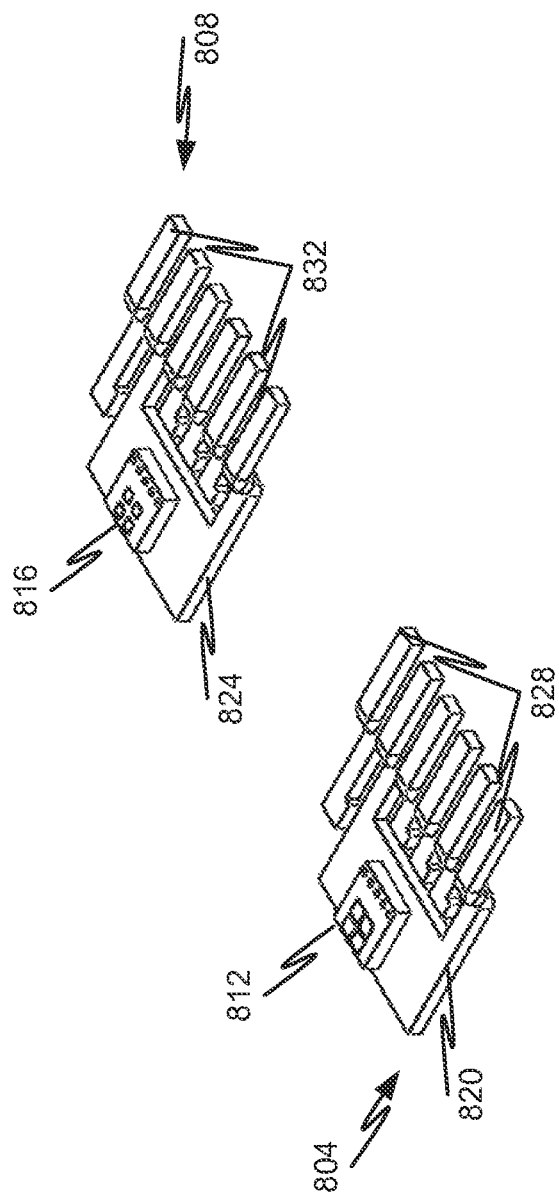
FIG. 8 is an isometric view of a first manufacturing step for manufacturing a capacitive isolator in accordance with embodiments of the present disclosure.

With reference now to FIGS. 8-12, details of a method of manufacturing an isolator will be described in accordance with at least some embodiments of the present disclosure. The method begins with the separate construction of a transmitting side 804 and receiving side 808 of the isolator (FIG. 8). The transmitting side 804 may also be configured to receive signals from receiving side 808 and the receiving side 808 may also be configured to transmit signal to the receiving side 804. Use of the terms "receiving" and "transmitting" side are merely used for illustrative purposes.

The transmitting side 804 may include a first lead frame portion 820 having a transmitting die 812 mounted thereon as well as a first set of leads 828. Similarly, the receiving side 808 may include a second lead frame portion 824 having a receiving die 816 mounted thereon as well as a second set of leads 832. The first set of leads 828 may connect to a high-voltage side of an isolation system whereas the second set of leads 832 may connect to a low-voltage side of the isolation system (or vice versa).

The number of leads 828, 832 included in a lead frame 804, 808, respectively, may vary from one to tens or hundreds. The depiction of six leads in both the first set of leads 828 and second set of leads 832 should not be construed as limiting embodiments of the present disclosure.

As shown in FIG. 8, the lead frame portions may be bent in such a way that the leads 828, 832 are not co-planar with the portion of the lead frames supporting the die 812, 816. The die 812, 816 may be mounted to the lead frame portions 820, 824 using adhesives, mechanical fittings, or the like.

Figure 9:
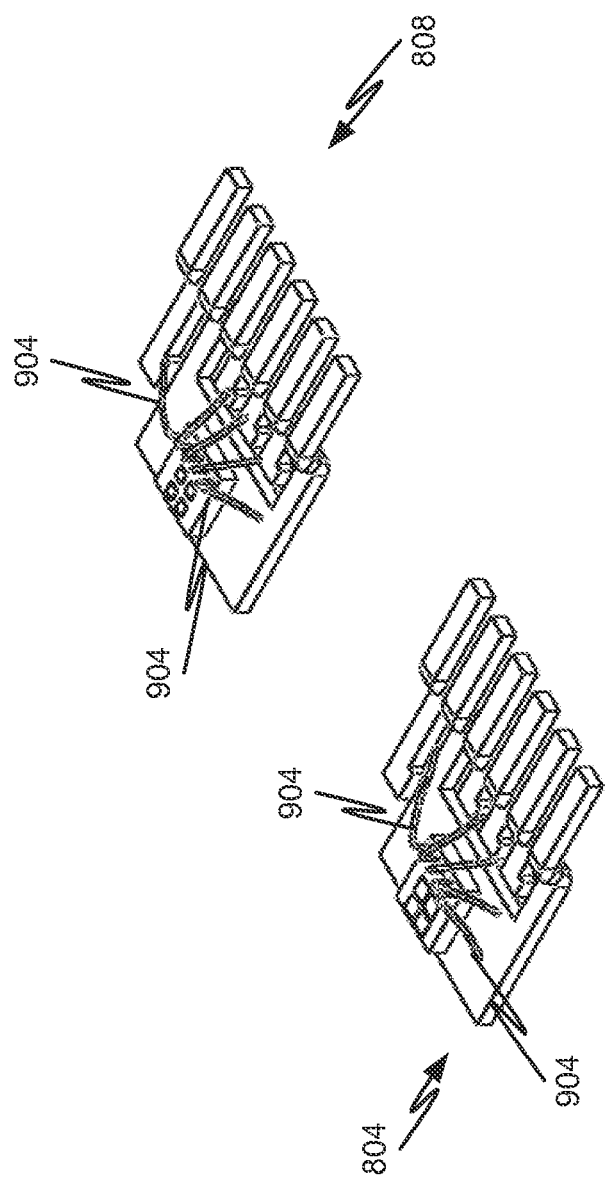
FIG. 9 is an isometric view of a second manufacturing step for manufacturing a capacitive isolator in accordance with embodiments of the present disclosure.

The manufacturing process continues by wire bonding some or all of the bonding pads included on each die to the leads of the lead frame (FIG. 9). Specifically, one side of a wire bond 904 may be soldered or otherwise attached to the bonding pads whereas the other side of a wire bond 904 may be soldered or otherwise attached to the lead frame or a specific lead on the lead frame portion.

Figure 10:
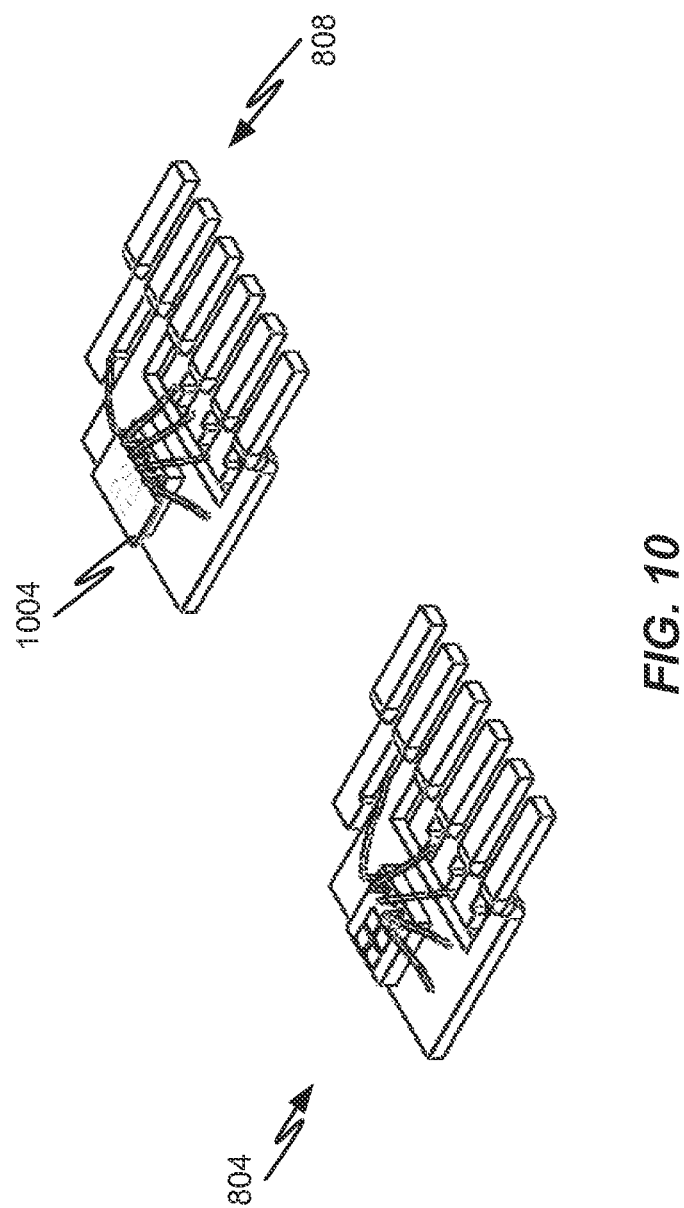
FIG. 10 is an isometric view of a third manufacturing step for manufacturing a capacitive isolator in accordance with embodiments of the present disclosure.
Figure 11:
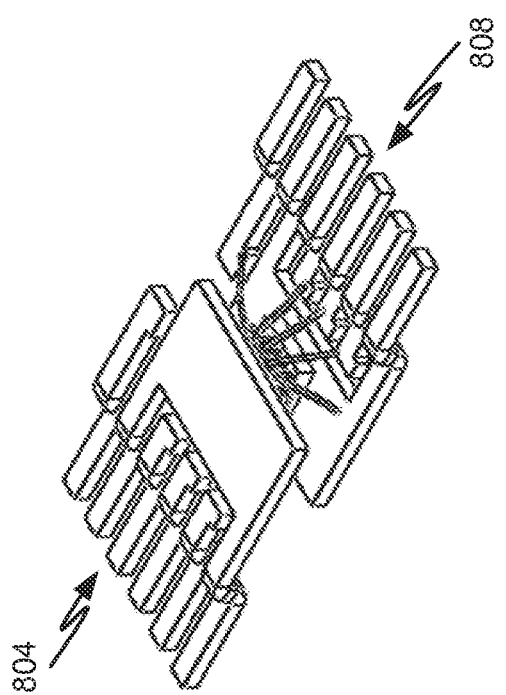
FIG. 11 is an isometric view of a fourth manufacturing step for manufacturing a capacitive isolator in accordance with embodiments of the present disclosure.
Figure 12:
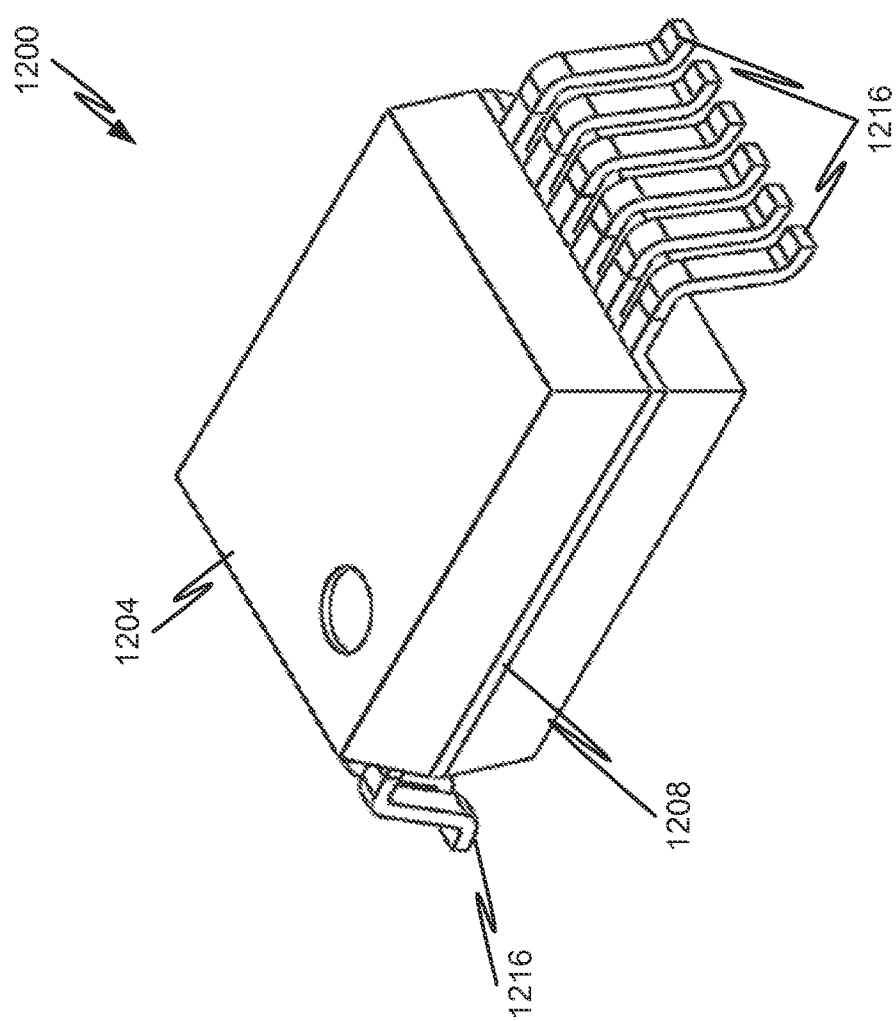
FIG. 12 is an isometric view of a fifth manufacturing step for manufacturing a capacitive isolator in accordance with embodiments of the present disclosure.

Thereafter, an isolation layer 1004 may be placed on one of the die to cover or overlie the capacitive elements thereof (FIG. 10). In some embodiments, the isolation layer 1004 may correspond to double-sided insulative tape that is cut to a desired length and then placed on one of the dies. In other embodiments, the isolation layer 1004 may correspond to a thin-film deposited on top surfaces of both dies and then openings may be established therein to expose the bonding pads of the dies. In such an embodiment, the formation of the isolation layer 1004 may occur before the wire bonding.

Once the isolation layer(s) 1004 is in position, the method continued by placing one lead frame over and adjacent to the other lead frame (step 1104 shown in FIG. 11), thereby placing the capacitive elements of one die in close proximity to the conductive pads of the other die. It should be appreciated that any number of placement methods could be used such as pick-and-place, folding, bending, flipping, etc. Moreover, the capacitive elements are placed close enough to one another to enable the transmission of information across the isolation boundary 112 established by the isolation layer(s) 1004. This placement process may be performed by an automated pick-and-place machine or the like.

The manufacturing process continues with a step of molding the lead frame portions 1208 and the die mounted thereon in a substantially fixed relative position with a housing 1204 or mold material. Additional manufacturing steps may include trimming the leads 1216 and forming the leads 1216 into a desired formation. Although the depicted embodiment shows the leads as having a specific configuration (e.g., surface mount configurations), it should be appreciated that the leads 1216 or relevant sections protruding from the housing 1204 may comprise any type of known, standardized, or yet-to-be developed configuration such as straight-cut leads, J leads, SOJ leads, gullwing, reverse gullwing, etc. The housing 1204 provides a way to protect the die and the other components attached thereto while the leads 1216 enable the isolator 1200 to be connected to external circuitry (e.g., a PCB).

Figure 13:
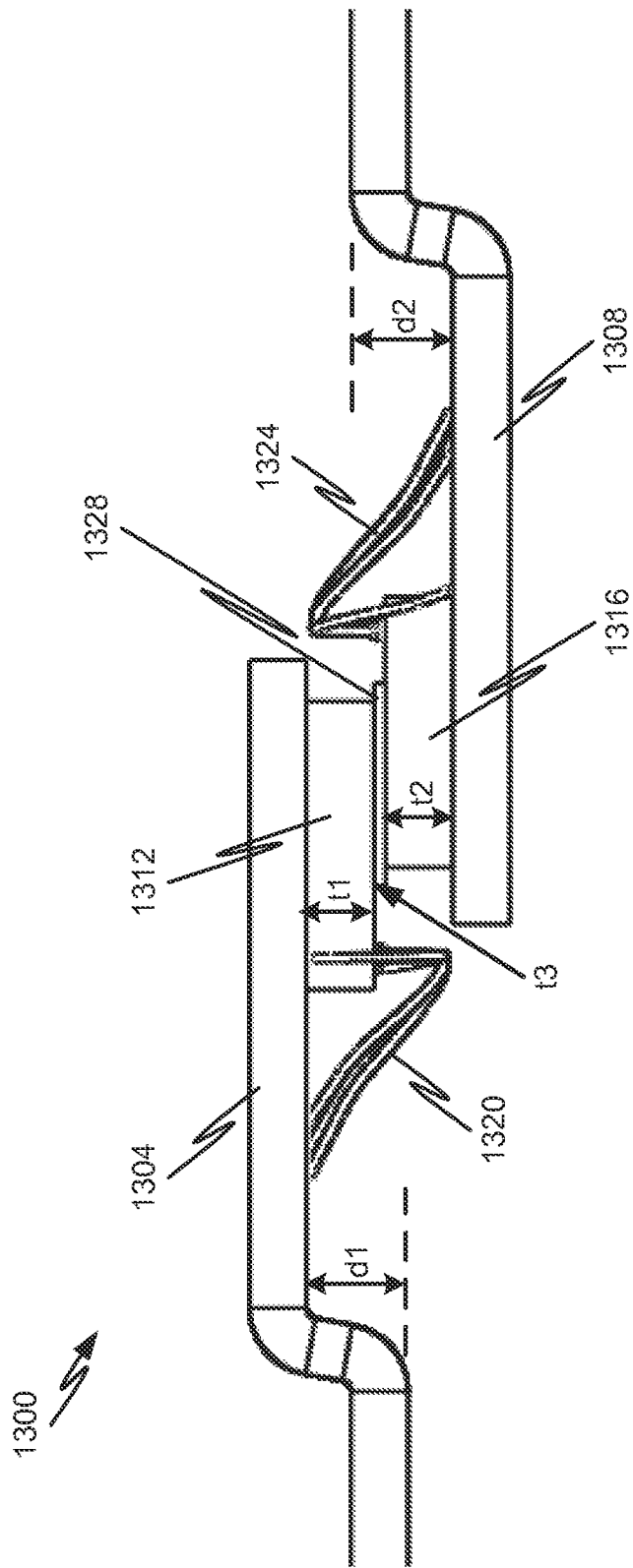
FIG. 13 is a side view of a capacitive isolator in accordance with embodiments of the present disclosure.
Figure 14:
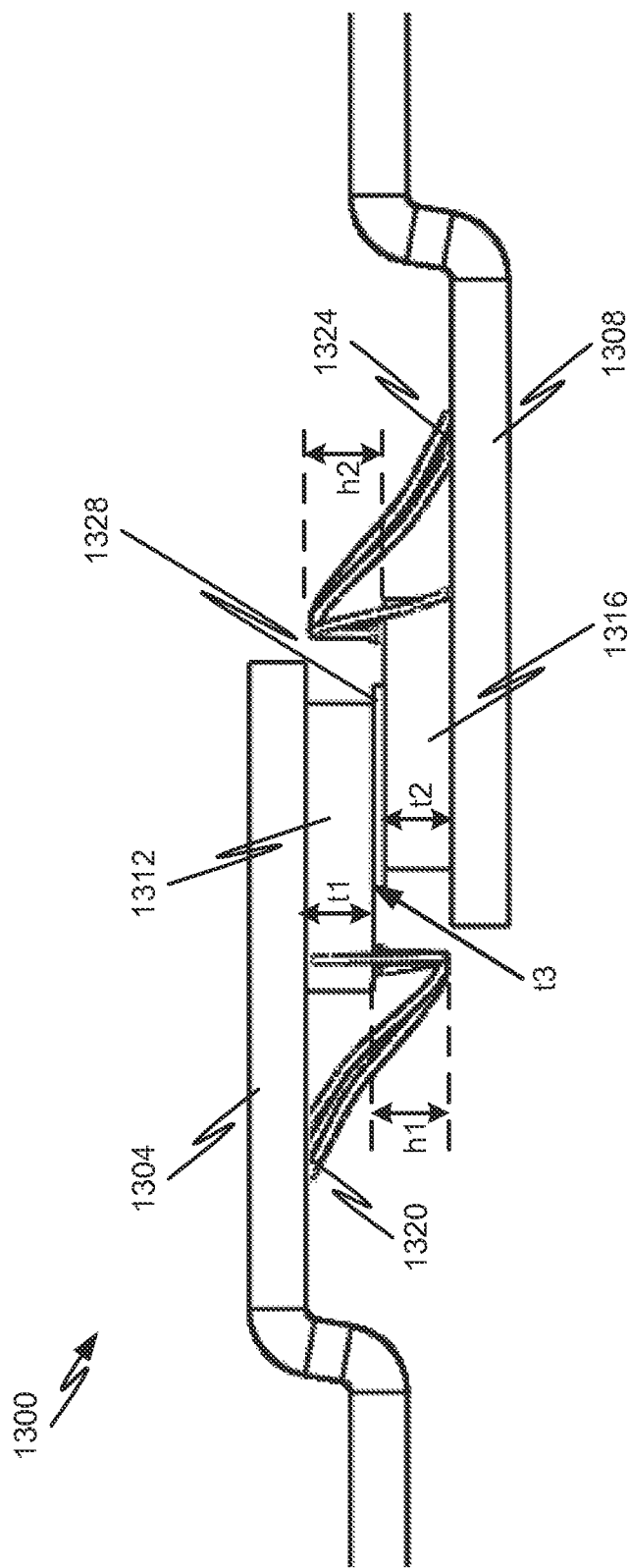
FIG. 14 is a side view of the capacitive isolator from FIG. 13 with a first set of dimensions depicted thereon.

With reference now to FIGS. 13 and 14 additional details regarding the dimensionality of the components in the isolation system 1300 will be described in accordance with at least some embodiments of the present disclosure. The isolation system 1300 may correspond to some or all of the isolator 1200 or any similar isolation system previously described herein. FIG. 13 shows the isolation system 1300 as comprising a first lead frame 1304, a second lead frame 1308, a first die 1312, a second die 1316, a first set of bonding wires 1320, a second set of bonding wires 1324, and an isolation layer 1328.

The first die 1312 is mounted on the first lead frame 1304 and the second die 1316 is mounted on the second lead frame 1308. As with other isolators described herein, the first die 1312 and second die 1316 are positioned in a face-to-face configuration with the isolation layer 1328 sandwiched therebetween. In some embodiments, the lead frames 1304, 1308 act as a Faraday shield against electromagnetic interference (EMI) as they enclose the two die 1312, 1316 and the isolation layer 1328. More specifically, the first and second lead frames 1304, 1308 may form a conductive enclosure that substantially surrounds the first and second dies 1312, 1316 such that the enclosure formed thereby substantially blocks external static and non-static electric and magnetic fields. In some embodiments, the first and second lead frames 1304, 1308 may be configured to have substantially constant voltage. The isolation layer 1328 may be embodied as any type of isolation layer already described herein.

As shown in FIG. 13, the first die 1312 comprises a first thickness t1 and the second die comprises a second thickness 1316 t2. The isolation layer 1328 may comprise a third thickness t3. The third thickness t3 is designed to have a good balance between voltage isolation and signal coupling between the first die 1312 and second die 1316. Preferably, the thickness variation of the isolation layer 1328 should be kept relatively small.

FIG. 13 also shows the first lead frame 1304 as having a first downset distance d1 and the second lead frame 1308 as having a second downset distance d2. The downset distances d1, d2 correspond to a dimension created by twice folding the lead frames 1304, 1308. In other words, the shortest distance from the bonding area of the lead frame and the leads of the lead frame may be considered the downset distance d1, d2. Said another way, the downset distance d1, d2 correspond to a height between a bonding surface of the lead frame and a top surface of the leads.

In some embodiments, the downset distances d1, d2 are designed to be similar or identical to one another. A valuable design consideration may attempt to have the downset distances d1, d2 such that both the first die 1312 and second die 1316 make contact with the isolation layer 1328 when the first die 1312 is positioned over the second die 1316.

FIG. 14 shows additional dimensions of the isolation system 1300. Specifically, the first set of bonding wires 1320 may have a first loop height h1 and the second set of bonding wires 1324 may have a second loop height h2. In some embodiments, the first loop heights h1 is approximately equal to the second loop height h2. Again, the thickness of the isolation layer 1328 is a third thickness t3.

In some embodiments, the first and second loop heights h1, h2 are designed to be smaller than the first and second thicknesses t1, t2, respectively. Such dimensionality helps to prevent the bonding wires 1320, 1324 from shorting to the top surface of the opposing lead frame 1304, 1308. In some embodiments, a margin of approximately 50 um is established between the thickness t1 or t2 and the loop height h1 or h2, respectively. Such a margin may be utilized when the third thickness t3 is approximately 25 um to 50 um itself. Advantageously, the total distance between the lead frames 1304, 1308 (e.g., the sum of t1, t2, and t3) is not much different from the combined thicknesses of the first die 1312 and second die 1316. In other words, the thin isolation layer 1328 results in the capacitive plates positioned on a surface or within the die 1312, 1316 are relatively close to one another, thereby facilitating an efficient transfer of information via the capacitor. Said another way, the percentage of the third thickness t3 to the total distance between the lead frames 1304, 1306 (e.g., the sum of t1, t2, and t3) may be less than 17%, or more specifically may be less than 14% and, in some embodiments, may be less than 12% and may even be as small as 2% or less.

Although embodiments of the present disclosure have been primarily concerned with describing the capacitive plates as being formed on surfaces of the first die 1312 and second die 1316, it should be appreciated that the capacitive plates (receiving and/or transmitting) may be formed elsewhere on or within the dies 1312, 1316. As a non-limiting example, one or both capacitive plates may be formed within their respective die 1312, 1316 rather than on a surface thereof. Additional details of such options for capacitive plate placement will now be discussed in connection with FIGS. 15 and 16.

Figure 15:
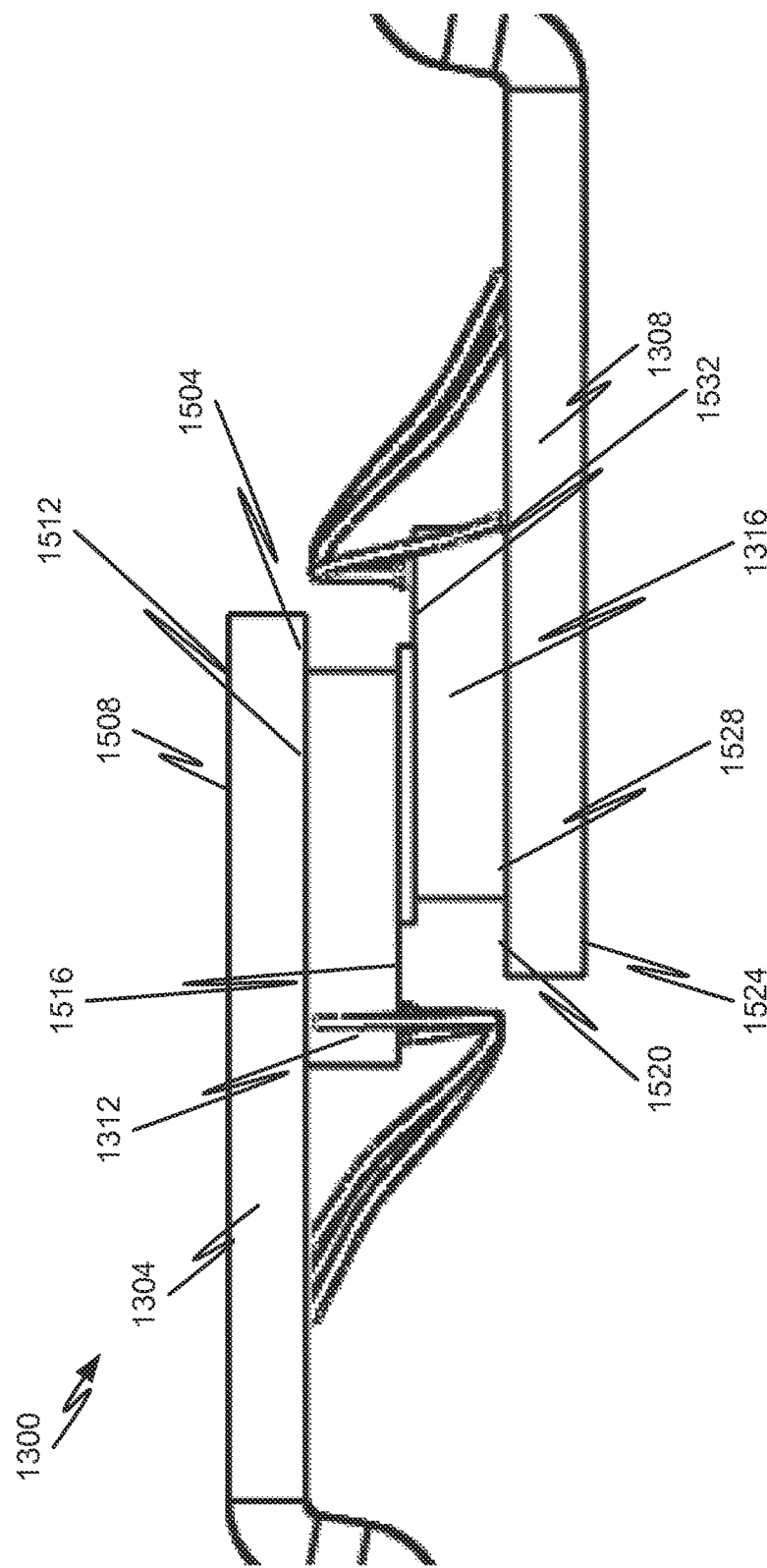
FIG. 15 is a side view of the capacitive isolator from FIG. 13 with additional details of the components depicted thereon.

Referring initially to FIG. 15, the first lead frame 1304 is shown to include a first surface 1504 and an opposing second surface 1508. The first surface 1504 of the first lead frame 1304 may be faced toward a first face 1520 of the second lead frame 1308. Like the first lead frame 1304, the second lead frame 1308 may also comprise a second surface 1524 that opposes the first surface 1520 thereof. In some embodiments, the total distance between the lead frames 1304, 1308 (e.g., the sum of t1, t2, and t3) may correspond to the shortest linear distance between the first surface 1504 of the first lead frame 1304 and the first surface 1520 of the second lead frame 1308.

The first surface 1504 of the first lead frame 1304 may have the first die 1312 mounted thereon. Likewise, the first surface 1520 of the second lead frame 1308 may have the second die 1316 mounted thereon. The first die 1312 may have a first surface 1512 and an opposing second surface 1516. The second die 1316 may also have a first surface 1528 and a second surface 1532. In the depicted embodiment, the first surface 1512 of the first die 1312 is in direct contact with the first surface 1504 of the first lead frame 1312. In other embodiments, the first surface 1512 of the first die 1312 may be adjacent to the first surface 1504 of the first lead frame 1312, but some intermediate material (e.g., a bonding material or tape) may be provided between the components. Similarly, the first surface 1528 of the second die 1316 may be mounted in direct contact with the first surface 1520 of the second lead frame 1316. In other embodiments, the first surface 1528 of the second die 1528 may be adjacent to the first surface 1520 of the second lead frame 1316, but some intermediate material may be provided between the components.

The second surface 1516 of the first die 1312 may be facing and proximate to the second surface 1532 of the second die 1316. The isolation layer 1328 may correspond to the only material that resides between the second surface 1516 of the first die 1312 and the second surface 1528 of the second die 1316. Using the dimensions shown in FIGS. 13 and 14, the distance between the second surface 1512 of the first die 1312 and the second surface 1532 of the second die 1316 may correspond to the third thickness t3, which may be relatively small as compared to the distance between the first surface 1504 of the first lead frame 1304 and the first surface 1520 of the second lead frame 1308.

Figure 16:
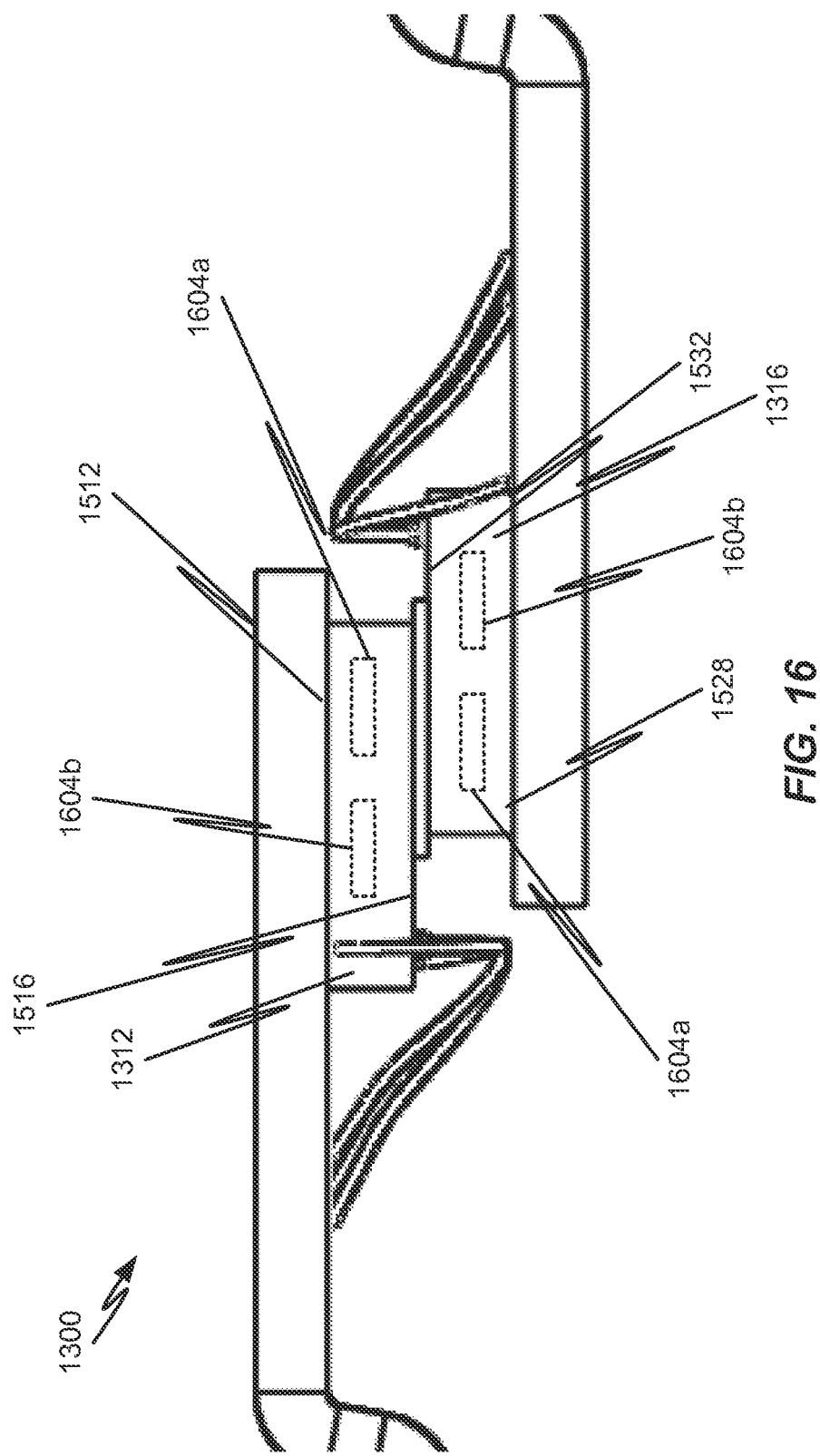
FIG. 16 is a side view of the capacitive isolator from FIG. 13 showing potential placement of driver circuitry in the die in accordance with embodiments of the present disclosure.

As previously described herein, the capacitive plates may be formed on the second surfaces 1516, 1532 of the first and second dies 1312, 1316, respectively. In other embodiments, one or both of the transmitting and receiving capacitive plates may be formed anywhere within the structure of the die. As one example, a capacitive plate (transmitting or receiving) may be formed on a first surface 1512, 1528 of either the first die 1312 or second die 1316. As another example, a capacitive plate (transmitting or receiving) may be formed somewhere between the first surface and second surface of the die. FIG. 16 shows two possible locations 1604a, 1604b for placement of a capacitive plate within the structure of the die 1304 or 1308. Additionally, the placement of the driver circuitry may also reside within the structure of the die or at a surface thereof (e.g., either the first surface of the die or the second surface of the die). As one example, the driver circuitry may be positioned at one of the possible locations 1604a, 1604b within the die 1312, 1316. As mentioned above, the driver circuitry may be positioned within the structure of the die and in an overlapping arrangement relative to a capacitive plate formed on a second or first surface of the die. Such a position may correspond, for example, to the first possible location 1604a. In another embodiment, the driver circuitry may be positioned within the structure of the die, but in a non-overlapping arrangement relative to a capacitive plate formed on a second or first surface of the die. Such a position may correspond, for example, to the second possible location 1604b.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An isolator, comprising:
a first semiconductor die comprising a first surface comprising a plurality of pads established thereon, wherein the plurality of pads established on the first surface of the first semiconductor die include:
a first capacitive element; and
a first bonding pad that facilitates wirebonding and enables an electrical connection between a first external circuit and the first capacitive element of the first semiconductor die;
a second semiconductor die comprising a first surface facing the first surface of the first semiconductor die, wherein the first surface of the second semiconductor die comprises a plurality of pads established thereon, wherein the plurality of pads established on the first surface of the second semiconductor die include:
a second capacitive element, wherein the first semiconductor die and second semiconductor die are positioned relative to one another such that the first capacitive element and second capacitive element oppose one another and at least partially overlap one another to form a capacitor; and
a second bonding pad that facilitates wirebonding and enables an electrical connection between a second external circuit and the second capacitive element of the second semiconductor die; and an isolation layer positioned between the first surface of the first semiconductor die and the first surface of the second semiconductor die so as to provide an electrical isolation boundary between the first external circuit and the second external circuit, wherein the isolation layer comprises at least one opening that exposes the first bonding pad and/or second bonding pad for wirebonding.

2. The isolator of claim 1, wherein the first capacitive element comprises a metal plate covered by a passivation layer.

3. The isolator of claim 2, wherein the first capacitive element and second capacitive element are both in physical contact with the isolation layer.

4. The isolator of claim 1, wherein the first capacitive element corresponds to a first receiving capacitive element, wherein the second capacitive element corresponds to a first transmitting capacitive element, and wherein an area of the first receiving capacitive element is smaller than an area of the first transmitting capacitive element.

5. The isolator of claim 4, wherein a first isolation capacitor is formed between the first receiving capacitive element and the first transmitting capacitive element and wherein the first isolation capacitor carries information from a drive signal across the electrical isolation boundary without directly flowing current across the electrical isolation boundary.

6. The isolator of claim 4, wherein the first semiconductor die further comprises a third capacitive element, wherein the second semiconductor die further comprises a fourth capacitive element, wherein the third and fourth capacitive elements oppose one another and at least partially overlap one another to form a second isolation capacitor.

7. The isolator of claim 6, wherein the third capacitive element corresponds to a second transmitting capacitive element, wherein the fourth capacitive element corresponds to a second receiving capacitive element, and wherein the second isolation capacitor is formed between the second receiving capacitive element and the second transmitting capacitive element and wherein the second isolation capacitor carries information from a drive signal across the electrical isolation boundary without directly flowing current across the electrical isolation boundary.

8. The isolator of claim 7, wherein the first transmitting capacitive element and the second transmitting capacitive element are arranged in a common centroid configuration.

9. The isolator of claim 1, wherein the first semiconductor die comprises first driver circuitry positioned between the first surface of the first semiconductor die and a second surface of the first semiconductor die, wherein the first driver circuitry carries electrical current from the first bonding pad to the first capacitive element.

10. The isolator of claim 9, wherein the first driver circuitry is positioned in at least a partial overlapping arrangement with respect to the first capacitive element.

11. The isolator of claim 1, wherein the isolation layer comprises a polyimide tape having adhesive on both sides thereof and wherein the isolation layer covers the first and second capacitive elements and exposes the first and second bonding pads.

12. The isolator of claim 1, wherein the isolation layer comprises a polyimide film formed on the first surface of the first semiconductor die as well as the first surface of the second semiconductor die.

13. The isolator of claim 1, wherein the first capacitive element comprises a main receiving portion and a secondary receiving portion, the main receiving portion including a first pad area, the secondary receiving portion including a plurality of second pad areas that are smaller than the first pad area, wherein the main receiving portion and the secondary receiving portion both overlap the second capacitive element.

14. The isolator of claim 13, wherein the plurality of second pad areas of the secondary receiving portion are selectively switchable on and off so as to enable adjustment of an effective size of the first capacitive element, thereby enabling adjustment of a capacitance between the first capacitive element and the second capacitive element.

15. The isolator of claim 14, further comprising a peak differential detector configured to compare a first peak amplitude measured between a first isolation capacitor established between the first semiconductor die and the second semiconductor die with a second peak amplitude measured between a second isolation capacitor established between the first semiconductor die and the second semiconductor die and based on such a comparison selectively switch on or off the second pad areas of the secondary receiving portion.

16. The isolator of claim 15, wherein the peak differential detector selectively switches on or off the second pad areas in an effort to equalize the first isolation capacitor with the second isolation capacitor.

17. The isolator of claim 13, wherein the plurality of second pad areas include a first pad of a first size and a second pad of a second size that is different from the first size.

18. An isolation system, comprising:
a first lead frame configured for connection to a first external circuit, the first lead frame having a bonding surface and a top surface of a lead that are separated by a first downset distance formed by folding the first lead frame, wherein a first die is mounted on the bonding surface of the first lead frame;
a second lead frame configured for connection to a second external circuit, the second lead frame having a bonding surface and a top surface of a lead that are separated by a second downset distance formed by folding the second lead frame, wherein a second die is mounted on the bonding surface of the second lead frame, wherein the first die and second die each have one or more capacitive elements established thereon, wherein the bonding surface of the first lead frame and the bonding surface of the second lead frame at least partially overlap and face one another, and wherein the first die and second die are positioned in a face-to-face configuration thereby creating one or more isolation capacitors between the first die and second die with overlapping capacitive elements; and
an isolation layer positioned between the first die and the second die so as to create an electrical isolation boundary between the first external circuit and the second external circuit.

19. The isolation system of claim 18, wherein the first die comprises a receiving capacitive element established on a top side of the first die, wherein the second die comprises a transmitting capacitive element established on a top side of the second die, and wherein the receiving capacitive element and transmitting capacitive element are both in direct physical contact with the isolation layer.

20. The isolation system of claim 19, wherein the first die further comprises one or more bonding pads that are established on the top side of the first die and adjacent to the receiving capacitive element, wherein the second die further comprises one or more bonding pads that are established on the top side of the second die and adjacent to the transmitting capacitive element, wherein the one or more bonding pads of the first die are wire bonded to the first lead frame, and wherein the one or more bonding pads of the second die are wire bonded to the second lead frame.

21. The isolation system of claim 20, wherein a first set of bonding wires connecting the first lead frame to the one or more bonding pads of the first die have a first bonding loop height, wherein a second set of bonding wires connecting the second lead frame to the one or more bonding pads of the second die have a second bonding loop height, wherein the first die has a first thickness, wherein the second die has a second thickness, and wherein the first bonding loop height and the second bonding loop height are each less than the combined first and second thickness so as to avoid shorts between the first external circuit and second external circuit.

22. The isolation system of claim 18, wherein the first lead frame and second lead frame function as a Faraday shield for the one or more isolation capacitors due to the one or more isolation capacitors being enclosed between the first lead frame and second lead frame.

23. The isolation system of claim 18, wherein a thickness of the first die and a thickness of the second die contribute to at least 76% of a distance between a first surface of the first lead frame and a first surface of the second lead frame.

24. The isolation system of claim 18, wherein a thickness of the first die summed with a thickness of the second die is no more than 50 um different from a total distance between the first lead frame and the second lead frame.

25. A capacitive isolator, comprising:
a first lead frame;
a second lead frame;
a first semiconductor die mounted to the first lead frame and having a first transmitting capacitive element;
a second semiconductor die mounted to the second lead frame and having a first receiving capacitive element, the second semiconductor die and first semiconductor die being positioned in a face-to-face configuration so as to at least partially overlap the first transmitting capacitive element with the first receiving capacitive element and create one or more isolation capacitors between the first the first semiconductor die and the second semiconductor die, wherein the first lead frame and the second lead frame are also mounted in a face-to-face configuration so as to at least partially overlap one another, and wherein the first lead frame and the second lead frame are both folded so as to at least partially surround sides of the first semiconductor die and second semiconductor die, thereby establishing a Faraday shield around the first semiconductor die and second semiconductor die; and
an isolation layer provided between the first semiconductor die and the second semiconductor die to create an electrical isolation boundary between the first transmitting capacitive element and the first receiving capacitive element.

26. The capacitive isolator of claim 25, wherein a total distance between the first and second lead frames substantially corresponds to a sum thickness of the first semiconductor die, the second semiconductor die, and the isolation layer.

27. The capacitive isolator of claim 25, wherein the thickness of the isolation layer contributes to less than 17% the sum thickness of the first semiconductor die, the second semiconductor die, and the isolation layer.

28. A capacitive isolation system, comprising:
a first lead frame;
a first die mounted on the first lead frame and having a first capacitive element formed thereon or therein;
a second lead frame;
a second die mounted on the second lead frame and having a second capacitive element formed thereon or therein, wherein the first and second capacitive elements are positioned in proximity to one another and are also positioned in an at least a partial overlapping relationship to establish an isolation capacitor therebetween, and wherein the first lead frame and second lead frame are also positioned in at least a partial overlapping relationship and are folded so as to create a Faraday shield around three dimensions of the isolation capacitor; and
an isolation layer residing between the first capacitive element and the second capacitive element.

29. The capacitive isolation system of claim 28, a first set of bonding wires electrically connects the first die to the first lead frame, wherein a second set of bonding wires electrically connects the second die to the second lead frame, and wherein a length of one or both of the first and second set of bonding wires is selected to substantially match a parasitic capacitance induced by one or both of the first and second set of bonding wires to a capacitance of the isolation capacitor.

30. The capacitive isolation system of claim 28, wherein the isolation layer comprises a thickness that is less than 14% of a distance between the first lead frame and the second lead frame.

* * * * *